US012591723B2

(12) United States Patent
Choi et al.

(10) Patent No.: US 12,591,723 B2
(45) Date of Patent: Mar. 31, 2026

(54) GENERATING RTL FOR A CIRCUIT USING DSP BLOCKS

(71) Applicant: Microsemi SOC Corp., Chandler, AZ (US)

(72) Inventors: Jongsok Choi, Toronto (CA); Devin Gibson, Vancouver (CA)

(73) Assignee: Microsemi SOC Corp., Chandler, AZ (US)

( * ) Notice: Subject to any disclaimer, the term of this patent is extended or adjusted under 35 U.S.C. 154(b) by 997 days.

(21) Appl. No.: 17/739,409

(22) Filed: May 9, 2022

(65) Prior Publication Data

US 2023/0034406 A1 Feb. 2, 2023

Related U.S. Application Data

(60) Provisional application No. 63/223,989, filed on Jul. 21, 2021.

(51) Int. Cl.
*G06F 30/327* (2020.01)
(52) U.S. Cl.
CPC .................................. *G06F 30/327* (2020.01)
(58) Field of Classification Search
USPC .......................................................... 716/106
See application file for complete search history.

(56) References Cited

U.S. PATENT DOCUMENTS

| | | | | |
|---|---|---|---|---|
| 11,356,101 B1 * | 6/2022 | Ho | .................... | H03K 19/17744 |
| 2003/0018882 A1 * | 1/2003 | Ganapathy | .......... | G06F 9/30072 |
| | | | | 712/E9.058 |
| 2006/0230094 A1 * | 10/2006 | Simkins | ............. | H03K 19/1737 |
| | | | | 708/625 |
| 2021/0099175 A1 * | 4/2021 | Liu | .................. | H03K 19/17712 |
| 2023/0034406 A1 * | 2/2023 | Choi | ..................... | G06F 30/327 |

OTHER PUBLICATIONS

Srinath, Shreesha et al., "Automatic Generation of High-Performance Multipliers for FPGAs with Asymmetric Multiplier Blocks," Field Programmable Gate Arrays, ACM, pp. 51-58, Feb. 21, 2010.

(Continued)

*Primary Examiner* — Mohammed Alam
(74) *Attorney, Agent, or Firm* — SLAYDEN GRUBERT BEARD PLLC

(57) ABSTRACT

A method may create RTL for a circuit design utilizing DSP blocks by receiving a software program comprising a multiplication statement to multiply a first number by a second number, the first number having a first data type and a first bit width, the second number having a second data type and a second bit width; determining a number of DSP blocks for implementing the statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more; and generating RTL for the statement, the RTL comprises a plurality of distinct portions corresponding to each of the two or more DSP blocks.

20 Claims, 23 Drawing Sheets

(56)                    References Cited

OTHER PUBLICATIONS

Moore, Ciara et al., "Targeting FPGA DSP Slices for a Large Integer Multiplier for Integer Based FHE," SAT $18^{th}$ International Conference, Lecture Notes in Computer Science, pp. 226-237, Apr. 1, 2023.

Rafferty, Ciara et al., "Evaluation of Large Integer Multiplication Methods on Hardware," IEEE Transactions on Computers, vol. 66, No. 8, pp. 1369-1382, Aug. 1, 2017.

International Search Report and Written Opinion, Application No. PCT/US2022/037659, 15 pages, Nov. 7, 2022.

International Search Report and Written Opinion, Application No. PCT/US2022/037659, 15 pages.

* cited by examiner

Figure 4:
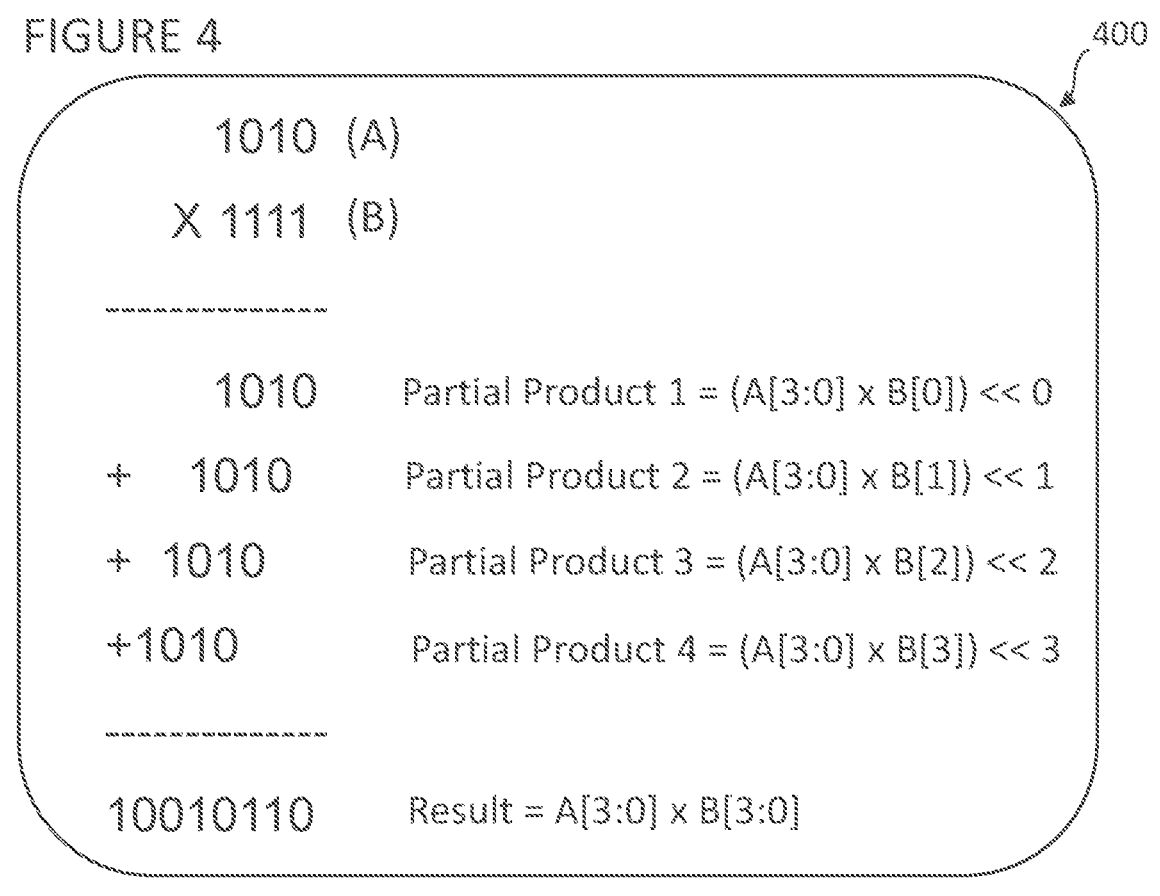

1010        Partial Product 1 = (A[3:0] x B[0]) << 0

+   1010        Partial Product 2 = (A[3:0] x B[1]) << 1

+  1010         Partial Product 3 = (A[3:0] x B[2]) << 2

+1010           Partial Product 4 = (A[3:0] x B[3]) << 3

----------------

10010110        Result = A[3:0] x B[3:0]

FIGURE 5                                                                500

$$[10][10] \quad (A1)(A0)$$

$$X \quad [11][11] \quad (B1)(B0)$$

-------------------

0110        AO x BO = (A[1:0] x B[1:0]) << 0

+   0110        A1 x BO = (A[3:2] x B[1:0]) << 2

+   0110        AO x B1 = (A[1:0] x B[3:2]) << 2

+0110        A1 x B1 = (A[3:2] x B[3:2]) << 4

-----------------

10010110        Result = A[3:0] x B[3:0]

FIGURE 7A

```
assign lhs_in_15_0 = dataa[15:0];
assign rhs_in_15_0 = datab[15:0];
```

DSP1                                    700

```
always @(posedge clock) begin
    if (reset) begin
        mul_0_lhs_reg <= 'd0;
    end else if (clken) begin
        mul_0_lhs_reg <= lhs_in_15_0;
    end
end
always @(posedge clock) begin
    if (reset) begin
        mul_0_rhs_reg <= 'd0;
    end else if (clken)) begin
        mul_0_rhs_reg <= rhs_in_15_0;
    end
end
assign mul_0_wire = (mul_0_lhs_reg *
mul_0_rhs_reg);
always @(posedge clock) begin
    if (reset) begin
        mul_0_reg_out <= 'd0;
    end else if (clken) begin
        mul_0_reg_out <= mul_0_wire;
    end
end
```

FIGURE 7B

```
assign rhs_in_31_16 = datab[31:16];
```

```
always @(posedge clock) begin                           DSP2
    if (reset) begin
        mul_1_lhs_reg <= 'd0;
    end else if (clken) begin
        mul_1_lhs_reg <= lhs_in_15_0;
    end
end
always @(posedge clock) begin
    if (reset) begin
        mul_1_rhs_reg <= 'd0;
    end else if (clken) begin
        mul_1_rhs_reg <= rhs_in_31_16;
    end
end
assign mul_1_wire = (mul_1_lhs_reg * mul_1_rhs_reg);
always @(posedge clock) begin
    if (reset) begin
        mul_1_reg_out <= 'd0;
    end else if (clken) begin
        mul_1_reg_out <= mul_1_wire;
    end
end
```

720

```
assign mul_result_slice_15_0 = mul_0_reg_out[15:0];
always @(posedge clock) begin
    if (reset) begin
        mul_result_slice_15_0_1 <= 'd0;
    end else if (clken) begin
        mul_result_slice_15_0_1 <= mul_result_slice_15_0;
    end
end
always @(posedge clock) begin
    if (reset) begin
        mul_result_slice_15_0_2 <= 'd0;
    end else if (clken) begin
        mul_result_slice_15_0_2 <= mul_result_slice_15_0_1;
    end
end
```

FIGURE 7C

```
assign lhs_in_31_16 = dataa[31:16];
always @(posedge clock) begin
    if (reset) begin
        lhs_in_31_16_1 <= 'd0;
    end else if (clken) begin
        lhs_in_31_16_1 <= lhs_in_31_16;
    end
end
always @(posedge clock) begin
    if (reset) begin
        rhs_in_15_0_1 <= 'd0;
    end else if (clken) begin
        rhs_in_15_0_1 <= rhs_in_15_0;
    end
end
```

740

```
    always @(posedge clock) begin              DSP3
        if (reset) begin
            mul_2_lhs_reg <= 'd0;
        end else if (clken) begin
            mul_2_lhs_reg <= lhs_in_31_16_1;
        end
    end
    always @(posedge clock) begin
        if (reset) begin
            mul_2_rhs_reg <= 'd0;
        end else if (clken) begin
            mul_2_rhs_reg <= rhs_in_15_0_1;
        end
    end
    assign mul_2_wire = (mul_2_lhs_reg * mul_2_rhs_reg);
    always @(posedge clock) begin
        if (reset) begin
            mul_2_reg_out <= 'd0;
        end else if (clken) begin
            mul_2_reg_out <= mul_2_wire;
        end
    end
```

```
always @(posedge clock) begin
      if (reset) begin                           Adder1
            add_0_reg <= 'd0;
      end if (clken) begin
            add_0_reg <= (mul_0_reg_out[31:16]
                              + mul_1_reg_out);
      end
end
```

780

```
always @(posedge clock) begin
      if (reset) begin                           Adder2
            mul_result_slice_31_16 <= 'd0,
      end if (clken) begin
            mul_result_slice_31_16 <=
                  (add_0_reg + mul_2_reg_out);
      end
end
```

```
assign result =
      {mul_result_slice_31_16,
       mul_result_slice_15_0_2};
```

FIGURE 9A

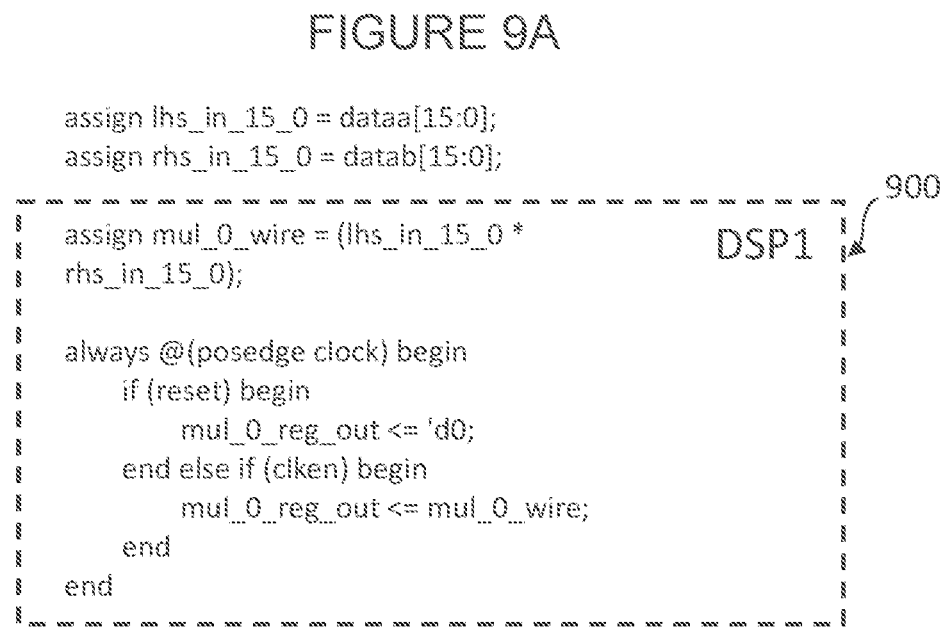

```
assign lhs_in_15_0 = dataa[15:0];
assign rhs_in_15_0 = datab[15:0];

assign mul_0_wire = (lhs_in_15_0 *                  DSP1
rhs_in_15_0);

always @(posedge clock) begin
    if (reset) begin
        mul_0_reg_out <= 'd0;
    end else if (clken) begin
        mul_0_reg_out <= mul_0_wire;
    end
end
```

```
assign rhs_in_31_16 = datab[31:16];
                                                            DSP2      920
assign mul_1_wire = (lhs_in_15_0 *
rhs_in_31_16g);
always @(posedge clock) begin
    if (reset) begin
        mul_1_reg_out <= 'd0;
    end else if (clken) begin
        mul_1_reg_out <= mul_1_wire;
    end
end assign mul_result_slice_15_0 = mul_0_reg_out[15:0];
always @(posedge clock) begin
    if (reset) begin
        mul_result_slice_15_0_1 <= 'd0;
    end else if (clken) begin
        mul_result_slice_15_0_1 <= mul_result_slice_15_0;
    end
end
always @(posedge clock) begin
    if (reset) begin
        mul_result_slice_15_0_2 <= 'd0;
    end else if (clken) begin
        mul_result_slice_15_0_2 <= mul_result_slice_15_0_1;
    end
end
```

FIGURE 9C

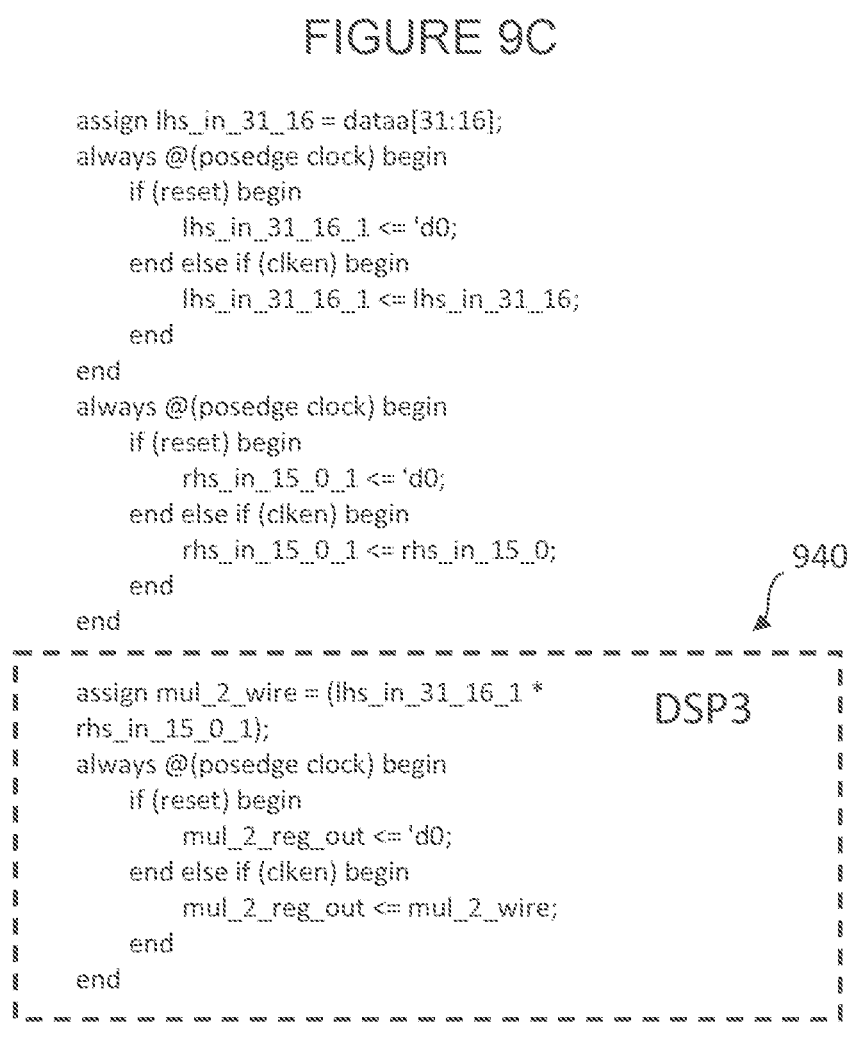

```
assign lhs_in_31_16 = dataa[31:16];
always @(posedge clock) begin
    if (reset) begin
        lhs_in_31_16_1 <= 'd0;
    end else if (clken) begin
        lhs_in_31_16_1 <= lhs_in_31_16;
    end
end
always @(posedge clock) begin
    if (reset) begin
        rhs_in_15_0_1 <= 'd0;
    end else if (clken) begin
        rhs_in_15_0_1 <= rhs_in_15_0;
    end
end
```

940

```
assign mul_2_wire = (lhs_in_31_16_1 *          DSP3
rhs_in_15_0_1);
always @(posedge clock) begin
    if (reset) begin
        mul_2_reg_out <= 'd0;
    end else if (clken) begin
        mul_2_reg_out <= mul_2_wire;
    end
end
```

```
always @(posedge clock) begin
    if (reset) begin                          Adder1
        add_0_reg <= 'd0;
    end if (clken) begin
        add_0_reg <= (mul_0_reg_out[31:16]
                      + mul_1_reg_out);
    end
end
```

980

```
always @(posedge clock) begin
    if (reset) begin                          Adder2
        mul_result_slice_31_16 <= 'd0,
    end if (clken) begin
        mul_result_slice_31_16 <=
            (add_0_reg + mul_2_reg_out);
    end
end
```

```
assign result =
    {mul_result_slice_31_16,
     mul_result_slice_15_0_2};
```

FIGURE 11

```
wire [31:0] dataA, dataB, result, output;
reg [31:0] dataA_reg0, dataB_reg0, ...;
reg [31:0] output_reg0, output_reg1, output_reg2;
always @(posedge clock) begin
    if (reset) begin
        dataA_reg0 <= 0;
        dataB_reg0 <= 0;
        dataA_reg1 <= 0;
        dataB_reg1 <= 0;
        output_reg0 <= 0;
        output_reg1 <= 0;
        output_reg2 <= 0;
    end else if (clock_en) begin
        dataA_reg0 <= dataA;
        dataB_reg0 <= dataB;
        dataA_reg1 <= dataA_reg0;
        dataB_reg1 <= dataB_reg0;
        output_reg0 <= result;
        output_reg1 <= output_reg0;
        output_reg2 <= output_reg1;
    end
end
assign result = dataA_reg1 * dataB_reg1;
assign output = output_reg2;
```

Figure 13:
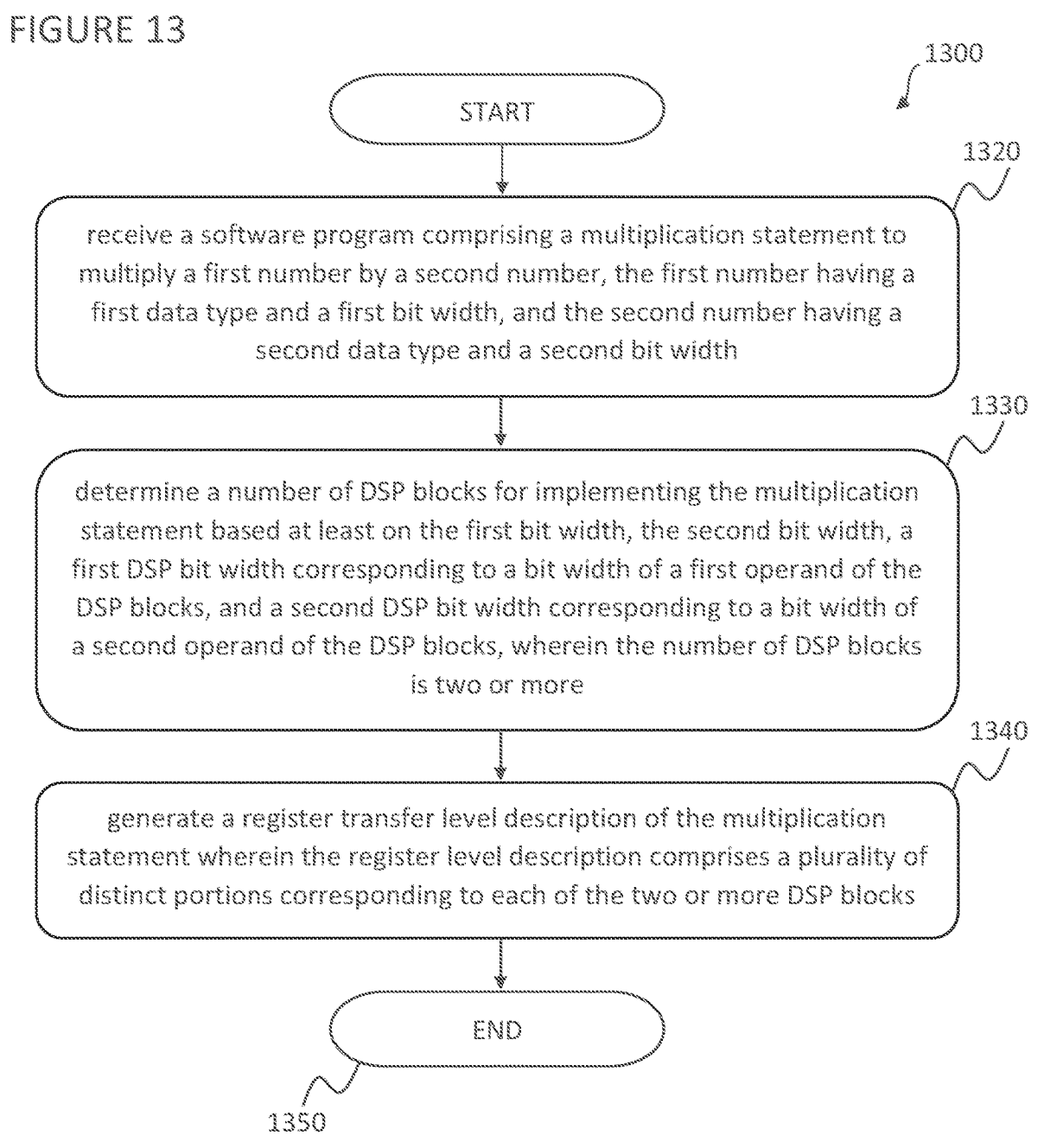

START

1320 receive a software program comprising a multiplication statement to multiply a first number by a second number, the first number having a first data type and a first bit width, and the second number having a second data type and a second bit width

1330 determine a number of DSP blocks for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more

1340 generate a register transfer level description of the multiplication statement wherein the register level description comprises a plurality of distinct portions corresponding to each of the two or more DSP blocks

END

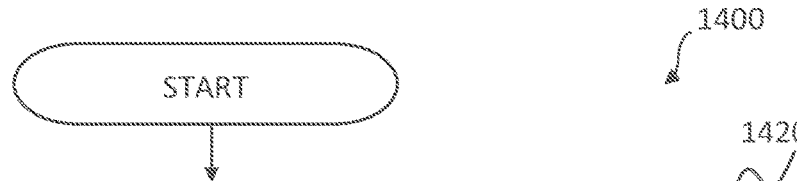

1400

START

1420 receive a software program comprising a multiplication statement to multiply a first number by a second number, the first number having a first data type and a first bit width, and the second number having a second data type and a second bit width

1430 determine a number of DSP blocks for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more

1435 determine a number of adder blocks for implementing the multiplication statement based at least on the first bit width, the second bit width, the first DSP bit width, and the second DSP bit width

1440 generate a register transfer level description of the multiplication statement wherein the register level description comprises a plurality of distinct portions corresponding to each of the two or more DSP blocks

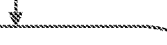

END

Figure 15:
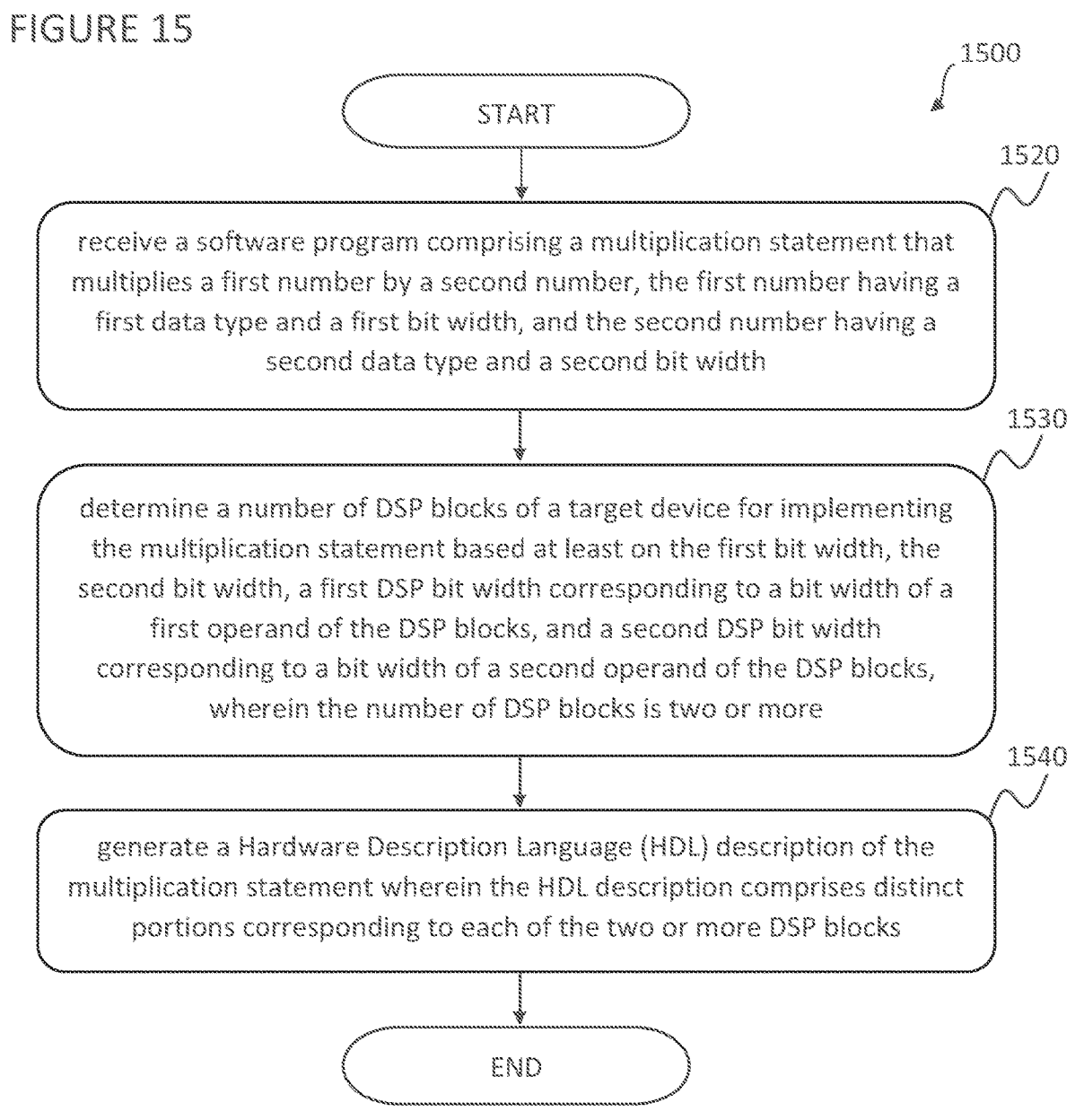

START

1520 receive a software program comprising a multiplication statement that multiplies a first number by a second number, the first number having a first data type and a first bit width, and the second number having a second data type and a second bit width

1530 determine a number of DSP blocks of a target device for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more

1540 generate a Hardware Description Language (HDL) description of the multiplication statement wherein the HDL description comprises distinct portions corresponding to each of the two or more DSP blocks

END

Figure 17:
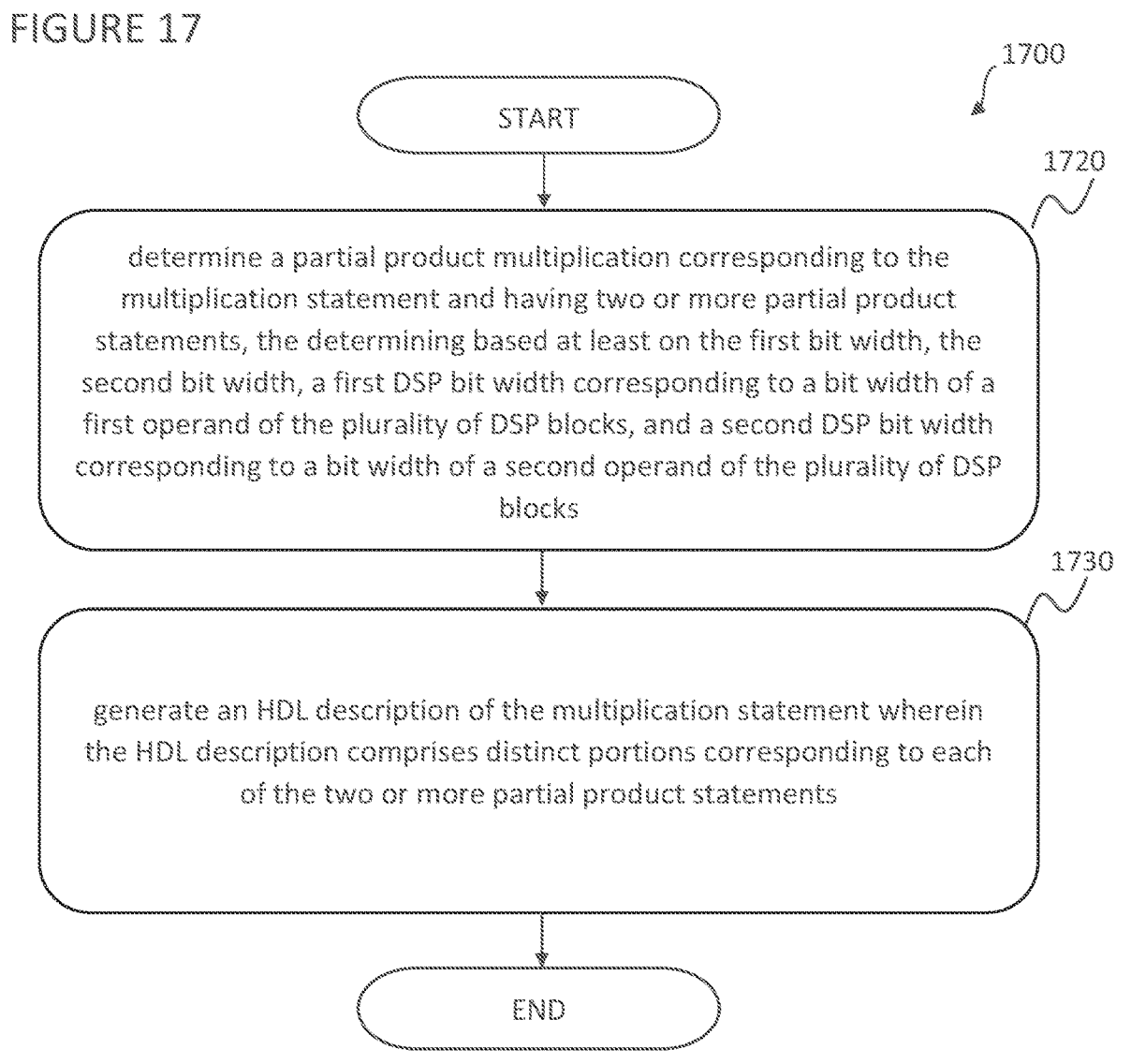

START

1720 determine a partial product multiplication corresponding to the multiplication statement and having two or more partial product statements, the determining based at least on the first bit width, the second bit width, a first DSP bit width corresponding to a bit width of a first operand of the plurality of DSP blocks, and a second DSP bit width corresponding to a bit width of a second operand of the plurality of DSP blocks

1730 generate an HDL description of the multiplication statement wherein the HDL description comprises distinct portions corresponding to each of the two or more partial product statements

END

GENERATING RTL FOR A CIRCUIT USING DSP BLOCKS

RELATED PATENT APPLICATION

This application claims priority to commonly owned U.S. Patent Application No. 63/223,989 filed Jul. 21, 2021, the entire contents of which are hereby incorporated by reference for all purposes FIELD OF TH E INVENTION The present application relates to the generation and definition of electronic circuits and hardware using hardware description languages and, more particularly, to mapping for high-level synthesis for field programmable gate array (FPGA) digital signal processing (DSP) blocks.

BACKGROUND

High-Level Synthesis (HLS) enables compiling a software program having a multiplication statement into a hardware circuit described in a register transfer level description of the multiplication statement, such as Hardware Description Language (HDL), which can be programmed onto an FPGA. HLS compilers may receive a software program having an operation and generate a hardware circuit to be programmed onto an FPGA.

Among other hardware, FPGAs may include Look Up Tables (LUTs), registers (e.g., D Flip-Flops (DFFs)), and dedicated DSP blocks. A LUT is basically a table that determines what the output is for any given input(s). In the context of combinational logic, an LUT is the truth table that effectively defines how the combinatorial logic should behave. DSP blocks can accelerate typical signal processing tasks, such as fast Fourier transforms and finite impulse response filtering. DSP blocks may also include dedicated multiplier hardware (although DSP blocks are useful for many things beyond straight multiplication). While multiplication may be implemented directly in non-DSP FPGA logic (LUTs and registers), that can require significant resources. Using dedicated DSP blocks for multiplication may benefit performance while minimizing resource use. Consequently, even small FPGAs typically dedicate space to DSP blocks.

To schedule an operation, the HLS compiler may have a delay model of the operation that characterizes the delay of each operation for each width and latency of interest. Some HLS tools support arbitrary bit-widths, which can be any bit-widths (e.g., 1-bit, 1024-bit), where two input bit-widths may not be the same. Even if a subset of bit widths and latencies are modeled, if a target DSP architecture changes (e g., different input bit-widths, different internal hardware resulting in different latencies, etc.), the entire model has to be re-created.

Other HLS compilers have the user choose the latency for the multiplication. An expert hardware designer may know how many cycles a certain multiplication operation should take. However, this knowledge is not portable across different DSP architectures.

HLS compilers schedule an operation and generate an output of the Verilog for the operation in a genetic way without technology mapping and convert the Verilog to a structural netlist via synthesis tools. While processing the output of the HLS compiler, different synthesis tools may infer the netlist differently. Some synthesis tools have issues utilizing the input/output registers when the multiplication widths exceed the DSP widths or when a clock enable signal is used. The style of the Verilog also affects the synthesis tool inference.

Some FPGA vendors provide multiplier IP blocks that are parameterized for widths and pipeline depths, but not all FPGA vendors provide this and the IP blocks are not portable to other vendors. Relying on the synthesis tool to infer automatically may have reliability and portability issues, with significant performance consequences.

There is a need for an HLS compiler that compiles a software program having a multiplication statement into a hardware circuit described in a register transfer level description of the multiplication statement, such as Hardware Description Language (HDL), which can be reliably programmed onto an FPGA.

SUMMARY

An apparatus may include a non-transitory, machine-readable medium including instructions. The instructions, when loaded and executed by a processor, may configure the processor to perform mapping for high-level synthesis using FPGA DSP blocks.

According to one example, there is provided a machine-implemented method for creating a register transfer level description of an electronic circuit design utilizing digital signal processing (DSP) blocks, comprising, receiving a software program comprising a multiplication statement to multiply a first number by a second number, the first number having a first data type and a first bit width, and the second number having a second data type and a second bit width; determining a number of DSP blocks for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more; and generating a register transfer level description of the multiplication statement wherein the register level description comprises a plurality of distinct portions corresponding to each of the two or more DSP blocks.

Another example provides an apparatus, comprising a non-transitory, machine-readable medium including instructions wherein the instructions, when loaded and executed by a processor, configure the processor to: receive a software program comprising a multiplication statement that multiplies a first number by a second number, the first number having a first data type and a first bit width, and the second number having a second data type and a second bit width; determine a number of DSP blocks of a target device for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more; and generate an HDL description of the multiplication statement wherein the HDL description comprises distinct portions corresponding to each of the two or more DSP blocks.

According to another example, there is provided a machine program product, the machine program product comprising a machine readable storage medium having program instructions embodied therewith, the program instructions executable by a computing device to cause the computing device to: convert a multiplication statement in software language into an HDL for a programmable hardware circuit having a plurality of DSP blocks, the multiplication statement comprising a first number multiplied by a second number, the first number having a first data type and a first bit width, and the second number having a second data type and a second bit width; wherein the converting comprises: determining a partial product multiplication corresponding to the multiplication statement and having two or more partial product statements, the determining based at least on the first bit width, the second bit width, a first DSP bit width corresponding to a bit width of a first operand of the plurality of DSP blocks, and a second DSP bit width corresponding to a bit width of a second operand of the plurality of DSP blocks; and generating an HDL description of the multiplication statement wherein the HDL description comprises distinct portions corresponding to each of the two or more partial product statements.

BRIEF DESCRIPTION OF THE DRAWINGS

The figures illustrate example methods, design flows, and systems for HLS mapping for generation of electronic circuit designs and creation of a register transfer level description of an electronic circuit design utilizing digital signal processing (DSP) blocks.

FIG. 4 illustrates an example of a 4-bit by 4-bit binary multiplication.

FIG. 5 illustrates an example of a 4-bit by 4-bit binary multiplication where the 4-bit values have been partitioned into four 2-bit values, to illustrate the mapping for DSPs with 2-bit inputs.

FIGS. 7A through 7D illustrate an example generated Verilog for a 32-bit by 32-bit unsigned multiplication mapped to 16-bit by 16-bit unsigned DSPs with both input and output registers utilized.

FIGS. 9A through 9D illustrate an example generated Verilog for a 32-bit by 32-bit unsigned multiplication mapped to 16-bit by 16-bit unsigned DSPs with only DSP output registers utilized.

FIG. 11 illustrates an example 5-cycle 32-bit multiplication in Verilog without technology mapping.

FIG. 13 illustrates a flow chart of an example method for HLS mapping.

FIG. 14 illustrates a flow chart of an example method for HLS mapping.

FIG. 15 illustrates a flow chart of an example method for HLS mapping.

FIG. 17 illustrates a flow chart of an example method for HLS mapping.

Figure 1:
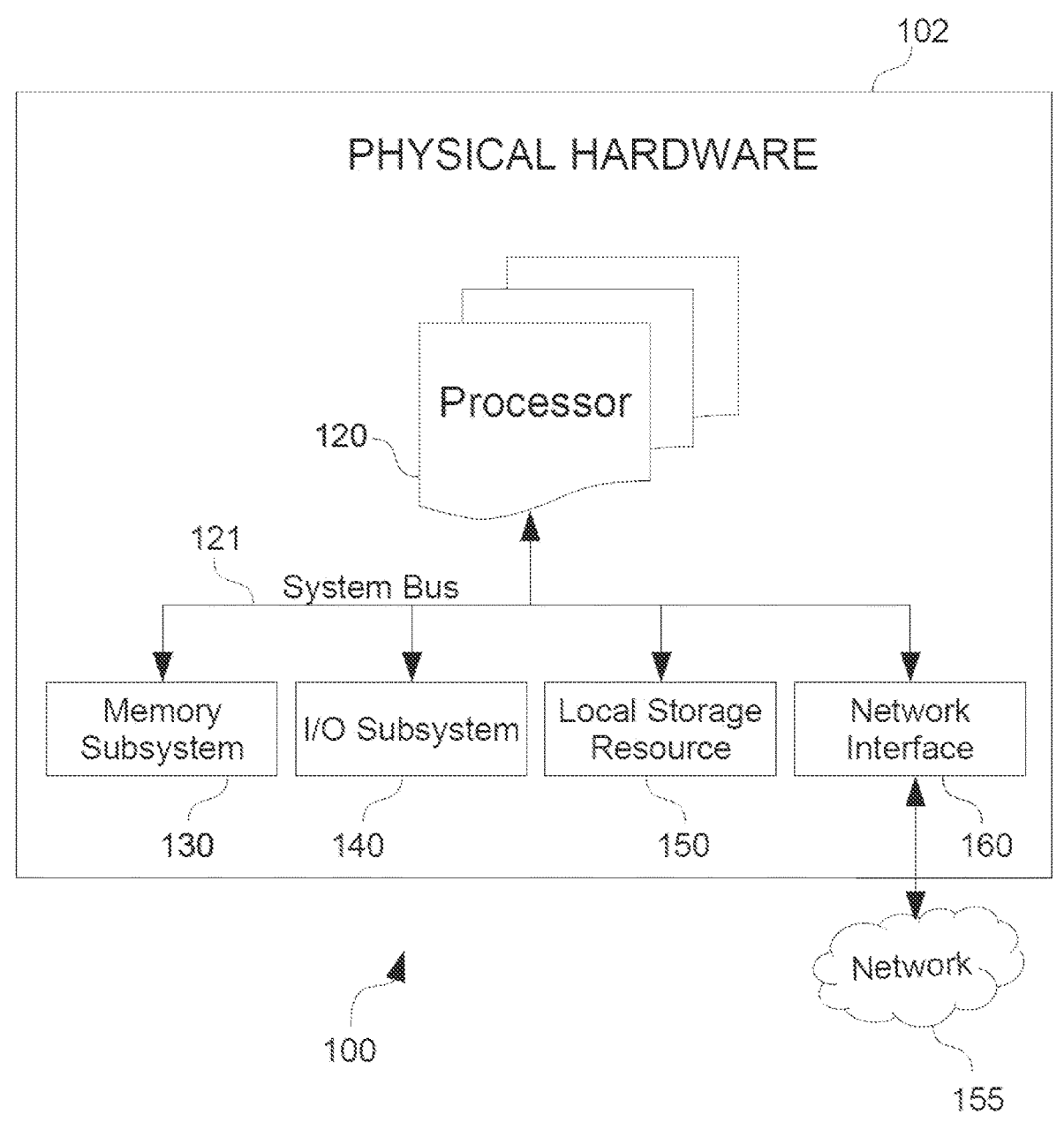
FIG. 1 illustrates a block diagram of an example system for HLS mapping.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

High-Level Synthesis (ILS) enables compiling a software program having a multiplication statement into a hardware circuit described in a register transfer level description of the multiplication statement, such as hardware description language (HDL), which can be programmed onto a Field-Programmable Gate Array (FPGA). Generating a high-performance circuit with multipliers using HLS may involve determining the number of cycles for the multiplication and implementing multiplication correctly and efficiently on an FPGA. A machine-implemented method may create a register transfer level (RTL) description of an electronic design utilizing digital signal processing (DSP) blocks. A machine program product may convert a multiplication statement in a high-level software language into an HDL for a programmable hardware circuit having a plurality of DSP blocks.

FPGAs may have DSP blocks that can be used to implement multiplications. Because DSP blocks are hardened ASICs (i.e, fixed, non-programmable circuits), they can run at high clock frequencies (500+ MHz) when utilized properly. DSP blocks can have input and output pipeline registers which may be utilized to achieve high maximum clock frequency (Fmax). The widths of a multiplication may determine how many DSPs may be used to implement the multiplication. The wider the multiplication width, the more DSPs may be used. Each additional DSP adds a delay. Hence with increasing multiplication widths, HLS may resolve how to increase the latency of the multiplication to maintain a high Fmax (e.g, increasing the latency may improve Fmax by allowing more time (specifically more registers) for performing the multiplication). However, the latency may not be overly increased, as increased circuit performance (runtime or latency/Fmax) may be achieved by minimizing the latency while increasing the Fmax. Increasing the use of pipeline registers on inputs and output of a multiplier increases the latency.

An FPGA synthesis tool (e.g., Synplify Pro, available from Synopsys, Inc., of Mountain View, Calif.) may map the available registers to the input and output pipeline registers of a DSP block to achieve high Fmax. When an FPGA synthesis tool does not optimally map the registers, the Fmax of the circuit may be lower. In general, a circuit on an FPGA may have a target Fmax, as the system clock will run at that speed, and if the target Fmax cannot be met, the circuit will be non-functional. If the DSP input/output registers are not utilized correctly, the circuit may be non-functional.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Additionally, the information handling system may include firmware for controlling and/or communicating with, for example, hard drives, network circuitry, memory devices, I/O devices, and other peripheral devices. As used in this disclosure, firmware includes any software embedded in an information handling system component used to perform predefined tasks. Firmware is commonly stored in non-volatile memory, or memory that does not lose stored data upon the loss of power. In certain examples, firmware associated with an information handling system component is stored in non-volatile memory that is accessible to one or more information handling system components. In the same or alternative examples, firmware associated with an information handling system component is stored in non-volatile memory that is dedicated to and comprises part of that component.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

FIG. 1 illustrates a block diagram of an example information handling system 100 for HLS mapping in accordance with the present disclosure. As depicted in FIG. 1, system 100 may comprise physical hardware 102. Components of physical hardware 102 may include, but are not limited to, one or more processors 120 and a system bus 121 that communicatively couples various system components to processors 120 including, for example, a memory subsystem 130, an I/O subsystem 140, local storage resource 150, and a network interface 160. The system bus 121 may be any suitable type of bus structure, e.g., a memory bus, a peripheral bus, or a local bus using any of a variety of bus architectures.

Network interface 160 may be any suitable system, apparatus, or device operable to serve as an interface between information handling system 100 and a network 155. Network interface 160 may enable information handling system 100 to communicate over network 155 using any suitable transmission protocol and/or standard. Network 155 and its various components may be implemented using hardware, software, or any combination thereof.

Processors 120 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data In some examples, processors 120 may interpret and/or execute program instructions and/or process data stored locally (e.g., in memory subsystem 130 and/or another component of physical hardware 102). In the same or alternative examples, processors 120 may interpret and/or execute program instructions and/or process data stored remotely.

Memory subsystem 130 may comprise any system, device, or apparatus operable to retain program instructions or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 100 is turned off.

Local storage resource 150 may comprise computer-readable media (e.g., hard disk drive, floppy disk drive, CD-ROM, and/or other type of rotating storage media, flash memory, EEPROM, and/or other type of solid state storage media) and may be generally operable to store data.

I/O subsystem 140 may comprise any system, device, or apparatus generally operable to receive and/or transmit data to/from/within information handling system 100. I/O subsystem 140 may comprise, for example, any number of communication interfaces, graphics interfaces, video interfaces, user input interfaces, and/or peripheral interfaces.

Figure 2:
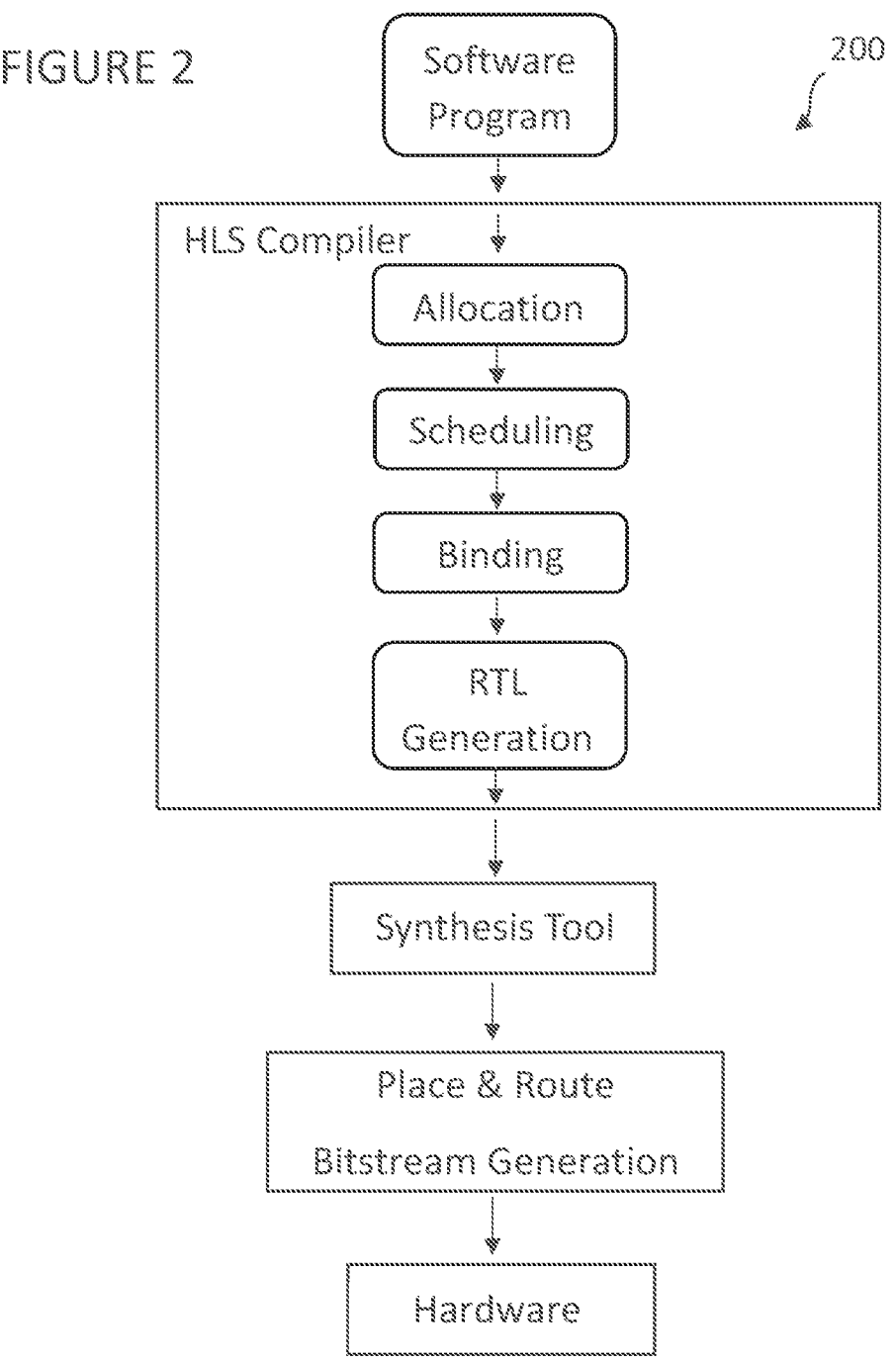
FIG. 2 illustrates an example HLS flow and system of generating a circuit and applying it to hardware.

FIG. 2 illustrates an example ILS flow 200 and system of generating a circuit and applying it to hardware. A software program (e.g., executing on information handling system 100) may be given to an HLS compiler, which may perform, among other operations, allocation, scheduling, binding and RTL generation. The HLS compiler may output a functionally equivalent circuit description in HDL. This HDL may be provided to a synthesis tool, such as Synplify Pro, which may produce a structural netlist. The netlist may be placed, routed, and converted to an FPGA bitstream that may be programmed onto hardware (e.g., an FPGA device). In Allocation, the input program may be analyzed to allocate an appropriate number of hardware operators. In Scheduling, operations in the input program may be scheduled into specific hardware clock cycles for each operation based on a delay model. In Binding, the operation may be bound to a hardware operator, and RTL Generation may generate the circuit in an HDL, such as Verilog. Examples described herein may augment the Scheduling and RTL Generation steps.

Figure 3:
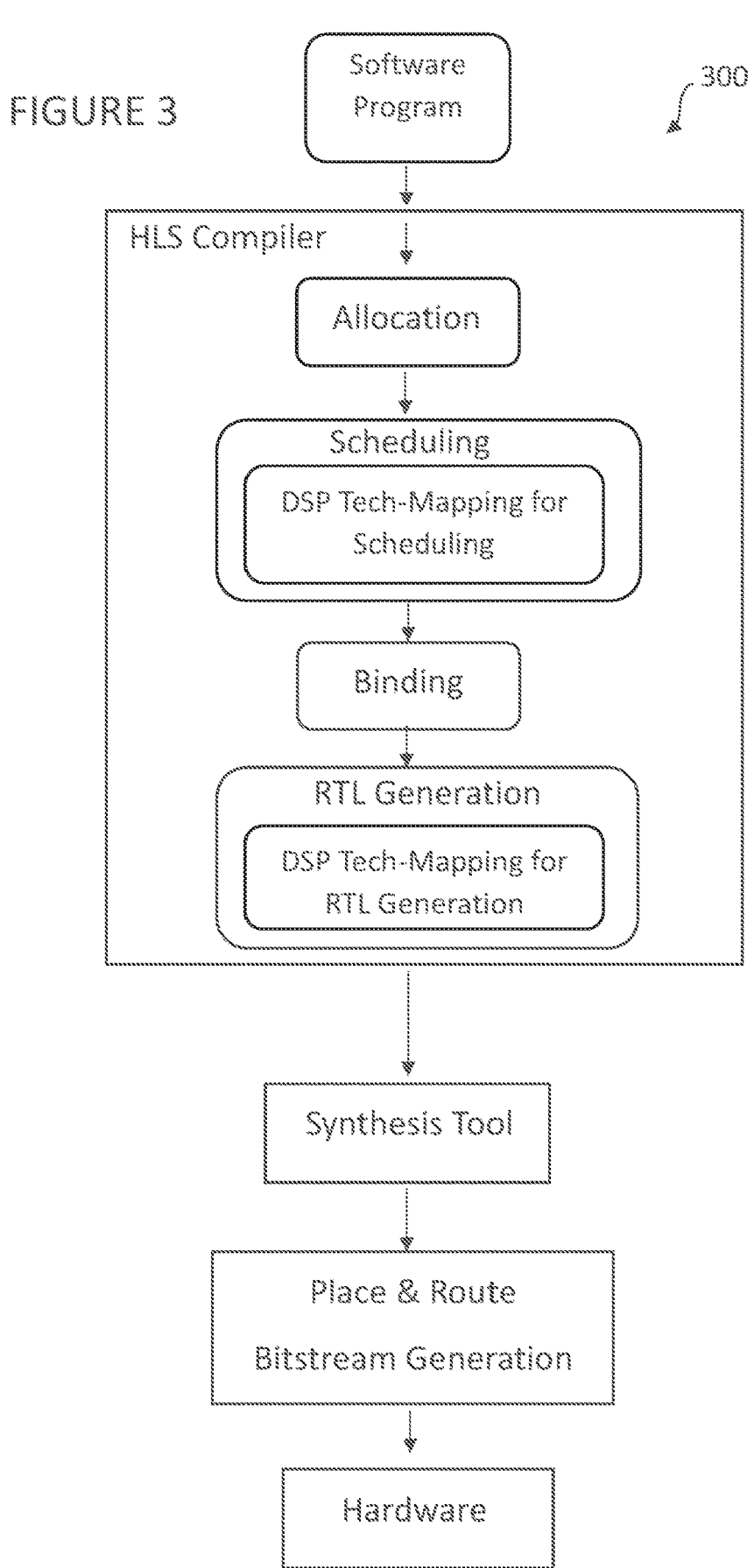
FIG. 3 illustrates an example technology mapping using an HLS compiler to map multiplications according to the target DSP architecture.

FIG. 3 illustrates technology mapping according to one example Technology mapping may use an HLS compiler to map all multiplications according to a target DSP architecture. For any multiplication with widths greater than the target DSP's widths, the HLS compiler may partition the multiplication into several smaller multiplications such that each smaller multiplication may map to and fit in a single DSP. For example, during Scheduling (DSP Tech-Mapping for Scheduling block), the HLS compiler may determine how many DSPs may be used for a multiplication, which it may use to determine the appropriate latency for the multiplication. The HLS tool may generate the circuit in HDL (DSP Tech-Mapping for RTL Generation block), such as Verilog, where each multiplier in Verilog (e.g., * operator)

may map to a single DSP and the DSP's input and output registers may be directly specified for the specific DSP. A synthesis tool may therefore use the generated HDL to map a DSP and utilize input and output pipeline registers of the mapped DSP, which may achieve a high Fmax.

According to one example. FIG. 3 shows a machine-implemented method 300 for creating a register transfer level description of an electronic circuit design utilizing digital signal processing (DSP) blocks and applying it to hardware. The HLS compiler may receive a software program comprising a multiplication statement to multiply a first number by a second number, the first number having a first data type and a first bit width, and the second number having a second data type and a second bit width. The HLS compiler may then perform an allocation, wherein the input program may be analyzed to allocate an appropriate number of hardware operators. The HLS compiler may then schedule the hardware operators into specific hardware clock cycles. The HLS compiler may then determine a number of DSP blocks for implementing the multiplication statement based at least on the first bit width, the second bit width, a first DSP bit width corresponding to a bit width of a first operand of the DSP blocks, and a second DSP bit width corresponding to a bit width of a second operand of the DSP blocks. Two or more DSP blocks having the same or different bit widths may be used. The HLS compiler may calculate the number of DSPs to implement the multiplication and may schedule operation accordingly. The HLS compiler may then perform binding, wherein the scheduled operation may be bound to a hardware operator. In an RTL generation, the HLS compiler may generate a register transfer level description of the multiplication statement wherein the register level description may comprise a plurality of distinct portions corresponding to each of the DSP blocks. The HLS compiler may partition each multiplication such that it may fit in the target DSP, as discussed herein. For example, a wide multiplication may utilize multiple smaller multipliers. The circuit may be generated in an HDL, such as Verilog. The HLS compiler may then provide the generated circuit described in HDL (with each multiplier mapped to the target DSP) to a synthesis tool to generate a structural netlist. The generated structural netlist may then be provided to place and route software to be placed and routed for bitstream generation. The generated bitstream may then be programmed onto hardware (e.g., an FPGA device).

Different FPGAs can have different DSP block architectures—Microsemi's PolarFire DSP receives two 18-bit inputs, but other FPGA's DSP block may receive one 27-bit input and one 18-bit input. Examples of the present disclosure allow specifying the DSP input widths to the HLS compiler, and a technology mapping algorithm of the HLS compiler may take into consideration the specified DSP input widths during the RTL generation, such that it may work for any specified DSP architecture. It may also flexibly utilize either the output register or both the input and output registers of each DSP. Utilizing just the output register may result in a lower latency and a moderately high Fmax, while using both input and output registers may achieve a higher Fmax at the expense of higher latency.

The HLS compiler accordingly may enable high-performance circuits to be generated automatically by determining the number of clock cycles that may be used for each multiplication and ensuring DSP blocks can be properly utilized.

Software is typically untimed and has no concept of clock cycles. The HLS compiler may take an untimed software program and compile the untimed software program to a timed hardware circuit, where each operation of the untimed software program may be scheduled to start at a specific clock cycle and to finish after a specific number of clock cycles. To produce a high-performance circuit, there are two metrics that may be adjusted, latency and maximum clock frequency. The latency of the entire circuit, i.e., the total number of clock cycles it takes for the circuit to finish its execution, may be lowered. The Fmax of the circuit, i.e., the maximum clock frequency that the circuit that run at, may be increased. The latency of the overall circuit may be determined by the latency of each operation of the circuit T hw HLS compiler may schedule operations such that a dependent operation starts after the operation it depends on, but independent operations may run in parallel. The latency of an operation may directly correlate with its Fmax. Up to a certain point, increasing the latency may allow achieving higher Fmax, as more pipeline registers may be inserted for the operation. The Fmax of the entire circuit may be determined by the longest delay path between two registers Thus, to produce a high-performance circuit, an HLS compiler may balance the latency and Fmax constraints, such that it inserts enough pipeline registers to meet the target Fmax, while not increasing the latency too much to degrade performance.

Multiply operations may map onto DSP blocks on FPGAs, hence their delays and Fmax may depend on the number of DSPs that are used to implement the multiplication. The number of DSPs consequently may depend on the width of the multiplication as well as the widths of the DSP blocks themselves. In order to achieve the same Fmax, multiplications of different bit-widths may have different latencies, and even for multiplications of the same bit-widths, they may have different latencies for DSP architectures (depending on the DSP's widths). Thus, an HLS compiler may be aware of the target DSP architecture. To do this, each multiplication may be mapped to the target DSP block, and if the width of multiplication exceeds the width of the target DSP, the multiplication may be partitioned into smaller multiplications with additions and shifts such that each partitioned multiplication fits in a DSP block, while producing the equivalent result to the unpartitioned multiplication.

FIG. 4 illustrates partial product multiplication to be performed by hardware, according to examples of the present disclosure. FIG. 4 shows an example of a standard 4-bit by 4-bit binary multiplication 400. The 4-bit (A) may be multiplied by each bit of (B), starting from its least significant bit, and the resulting partial products may be summed to get the final result. Each partial product may be shifted left by the position of the bit being multiplied by in (B), with the least significant bit at position 0. This way of multiplying may map naturally to a DSP block with 4-bit by 1-bit inputs, where each partial product may map to a DSP block. With that, the above multiplication may be implemented using 4 DSPs and 3 adders. To follow this method for multiplication of any bit-width operands, DSPs with (1) one input that may match one multiplication operand of any bit-width and (2) a second, 1-bit wide input may be used. However, this may not be feasible and practical.

FIG. 5 illustrates another partial product multiplication 500 that may be performed by hardware according to another example of the present disclosure. FIG. 5 shows the same multiplication as FIG. 4, but where the 4-bit values have been partitioned into four 2-bit values, to illustrate mapping for a DSP with 2-bit inputs. This multiplication may produce the same result as the multiplication of FIG. 4, and may be done with four 2-bit by 2-bit DSPs and 3 adders.

The method of partitioning as exemplified in FIGS. 4 and 5 may allow for multiplication of a first number of any data type and bit width by a second number of any data type and bit width. A number of DSP blocks may be determined for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more. A register transfer level description of the multiplication statement may be generated wherein the register level description may comprise a plurality of distinct portions corresponding to each of the two or more DSP blocks.

Figure 6A:
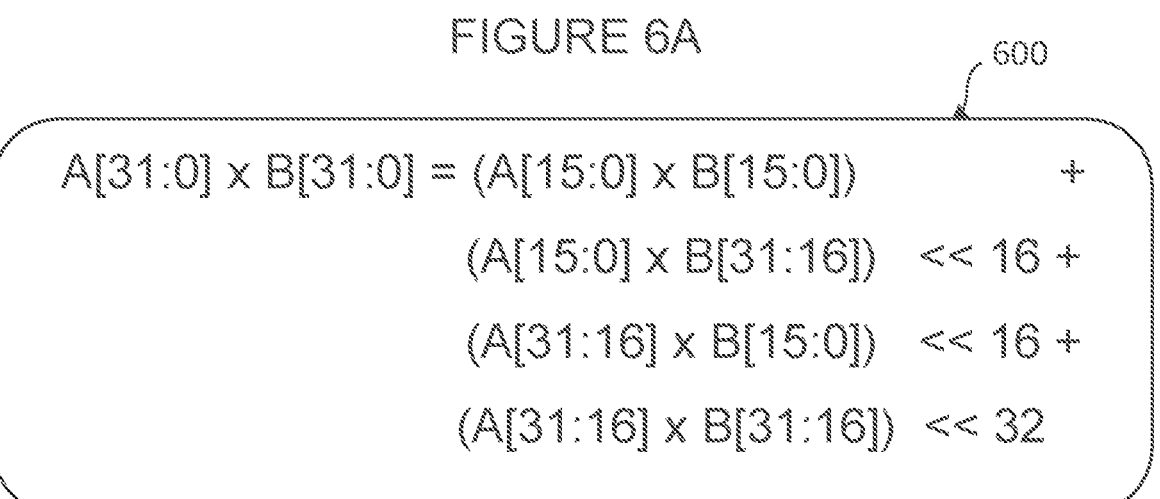
FIG. 6A illustrates an example 32-bit by 32-bit multiplication partitioned into 16-bit by 16-bit multiplications to produce a 64-bit result.
Figure 6B:
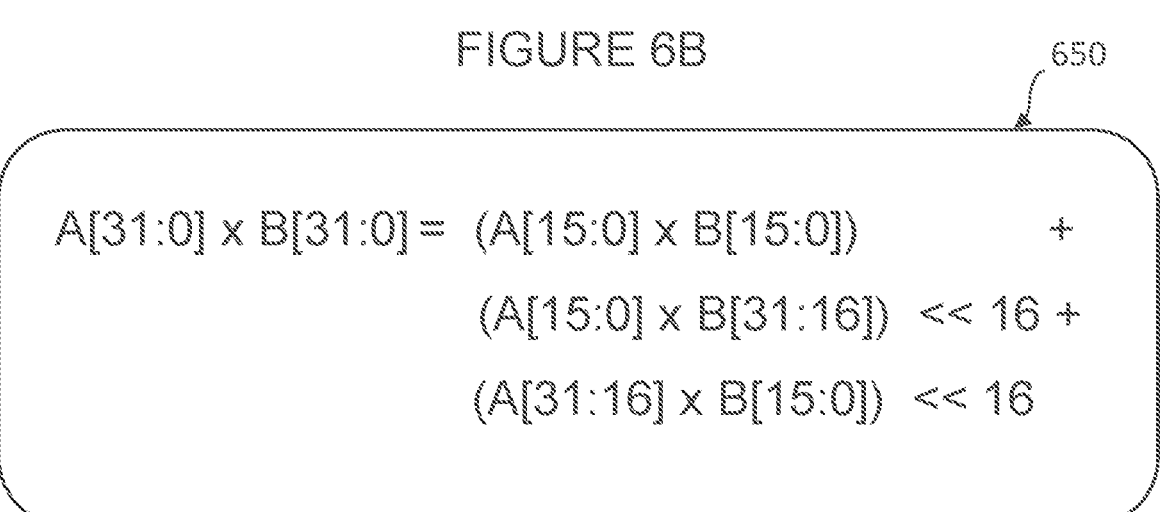
FIG. 6B illustrates an example 32-bit by 32-bit multiplication partitioned into 16-bit by 16-bit multiplications to produce a 32-bit result.

A 32-bit by 32-bit multiplication may be partitioned into 16-bit by 16-bit multiplications as shown in FIGS. 6A and 6B. The multiplication of FIG. 6A may produce a 64-bit result. The multiplication of FIG. 6B may produce a 32-bit result.

FIG. 6A shows multiplication 600 with input values, (A) and (B), split into four 16-bit values, where the most significant 16 bits of two inputs may be multiplied, the top 16 bits and bottom 16 bits may be multiplied, and the bottom 16 bits may be multiplied; and all resultant values may be summed together, with appropriate shifting. This may use four 16-bit by 16-bit DSPs and three adders to produce a 64-bit result.

Note that in software, the input and output data types may be the same. Hence a 32-bit unsigned multiplication may be expressed as: "unsigned int result=a*b", where "a" and "b" may also be unsigned integer data types. This means that two 32-bit values may be multiplied to produce a 32-bit result. In this case, the last multiplication in FIG. 6B, where the shift left amount exceeds the width of the result, may be truncated and may be removed Hence the 32-bit multiplication may use three DSPs and two adders, as shown for multiplication 650 in FIG. 6B.

The equation in FIG. 6A may be generalized to an equation (EQ1) for unsigned multiplications as follows:

$$\text{Unsigned } A\,[Wa-1:0] \times \text{Unsigned } B\,[Wb-1:0] =$$

$$\sum_{Na=0}^{ceil\left(\frac{Wa}{Da}\right)-1} \sum_{Nb=0}^{ceil\left(\frac{Wb}{Db}\right)-1} \left(A\,[MSBa:LSBa] \times B\,[MSBb:LSBb]\right) \ll$$

$$(LSBa + LSBb)$$

Where:

Wa=Width of input A, Wb=Width of input B
Da=Width of DSP input A, Db=Width of DSP input B
Ceil(X)=round the value of X to the small integral value that is not less than X (e.g, ceil(2.3)=3)
MSBa=min (Wa, Da×(Na+1))−1, MSBb=min (Wb, Db× (Nb+1))−1
LSBa=Da×Na, LSBb=Db×Nb
min(X, Y)=choose minimum value between X and Y.

The equation to determine the number of DSP blocks that may be used for a multiplication is as follows:

Number of DSPs used=ceil(Wa/Da)×ceil(Wb/Db)−
(number of DSPs where (LSBa+LSBb)>=multi-
plication result width)

As described for FIG. 6B, the multiplications and the partial additions for when the shift left amount, LSBa+ LSBb, exceeds the multiplication output width may be removed. Some DSPs have a bit that may be used as the signed bit. For example, Microsemi PolarFire DSPs can support 17-bit by 17-bit unsigned multiplications and 18-bit by 18-bit signed multiplications, hence the most significant bit is used for the signed bit. In this case, for mapping a signed multiplication, the signed DSP width may be used for mapping the signed bits and the unsigned DSP width may be used for mapping the unsigned bits. When partitioning, which partition has the signed bits and which partition has the unsigned bits may be tracked, such that the partitions may be sign-extended or zero-extended as desired. The partition with the most significant bit may be the signed partition and multiplying a signed partition with another signed partition may create a signed result. If the signed partition bits are smaller than the signed width of DSP, they may be sign-extended to match the signed width. Multiplying two unsigned partitions may create an unsigned result.

When multiplying a signed partition with an unsigned partition, the unsigned partition may be zero extended to be interpreted as a signed partition, and the signed partition may be sign-extended if it is less than the signed width of DSP, such that two full signed partitions may be multiplied to create a signed result. For example, for a 32-bit by 32-bit signed multiplication for the Microsemi PolarFire DSP architecture (18×18 signed, 17×17 unsigned), the partition may be performed as shown in Table 1:

TABLE 1

| | |
|---|---|
| Signed A[31:0] × Signed B[31:0] = | Signed 15-bit by signed |
| (({{3{A[31]}}, A[31:17]} × {{3{B[31]}}, B[31:17]}) << 34) + | 15-bit. Sign-extended to make signed 18 bits |
| (({{3{A[31]}}, A[31:17]} × {1'd0, B[16:0]}) << 17) + | Signed 15-bit by unsigned 17-bit Signed/zero-extended to make signed 18 bits |
| (({1'd0, A[16:0]} × {{3{B[31]}}, B[31:17]}) << 17) + | Unsigned 17-bit by signed 15-bit. Signed/zero-extended to make signed 18 bits |
| (A[16:0] × B[16:0]) | Unsigned 17-bit by unsigned 17-bit |

Equation EQ1 generally applies to signed multiplication, except that the partitions may be sign-extended or zero-extended as desired (as in the example above).

There may be two schemes for utilizing a DSP's input and output registers fully-pipelined and half-pipelined. In both schemes multiplies may be scheduled in series, with results used in a chain of adders. The half-pipelined scheme may use output DSP registers and insert a register after each other adder, while the fully-pipelined scheme may use both the input and output DSP registers and insert a register after each adder. This half-pipelined scheme will have a latency of floor(number of DSPs/2)+1, and the fully pipelined scheme will have a latency of (number of DSPs)+1, where floor(X) rounds X down to the largest integral value that is not greater than X. Once the latency has been determined by the Scheduling block (e g., FIG. 3), the partitioned multiply operators may be generated in Verilog in the RTL Generation block (e.g., FIG. 3). For example, a 32-bit by 32-bit unsigned multiplication that is mapped to 16-bit by 16-bit unsigned DSPs with both input and output registers utilized may be generated in Verilog as shown in FIGS. 7A-7D. The dotted boxes of the figures show which portions of the Verilog maps which DSPs and adders, with a total of 3 DSPs and 2 adders. In this case, the outputs of both adders may be registered, which may map to carry-chains and registers on an FPGA.

Figure 8:
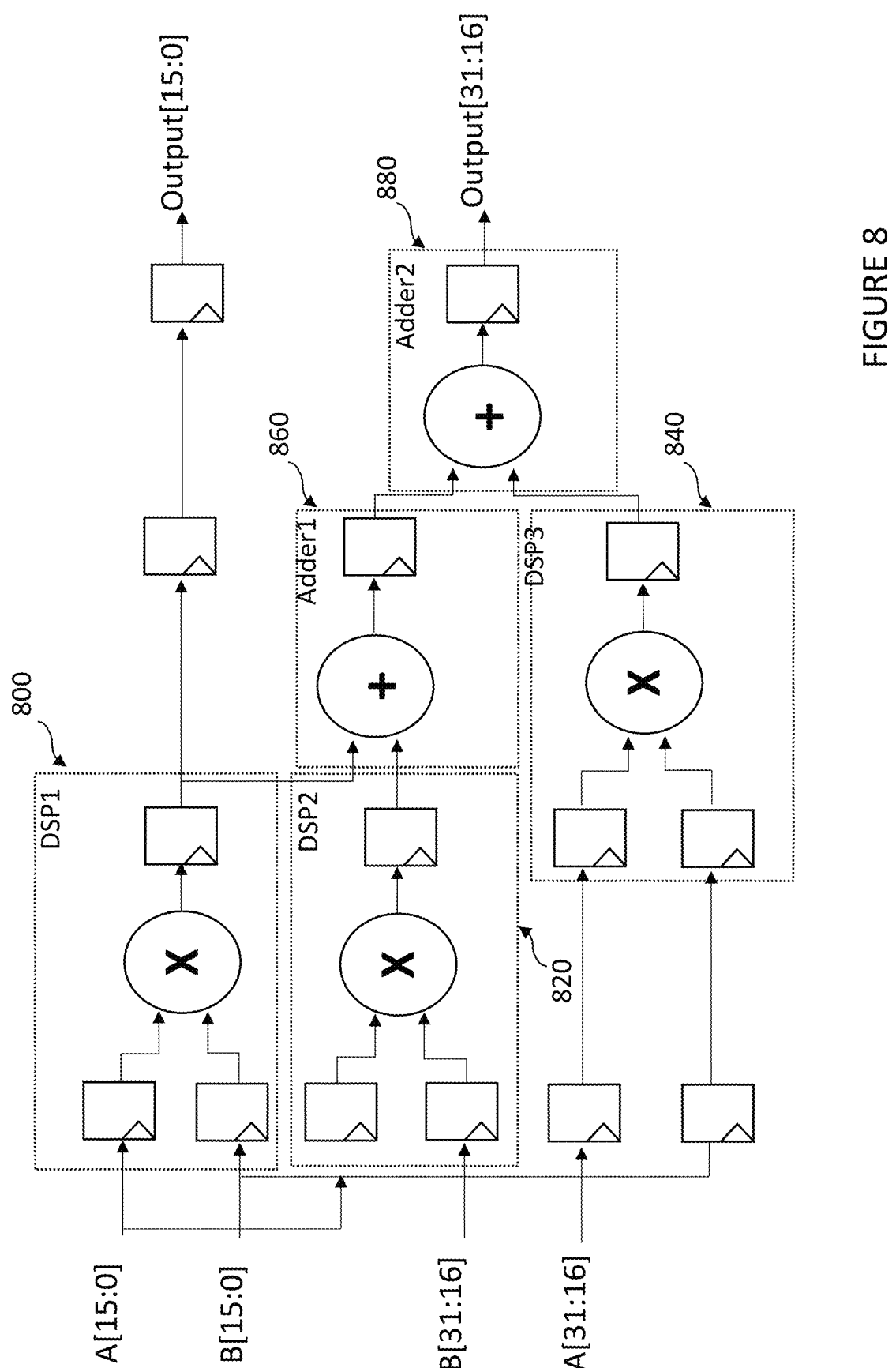
FIG. 8 illustrates an example circuit diagram for the Verilog shown in FIGS. 7A through 7D, wherein the dotted boxes show which sections of the diagram maps to DSPs and adders.

The Verilog in FIGS. 7A-7D may be represented by the circuit diagram shown in FIG. 8. The dotted boxes in FIG.

8 may also show which sections of the diagram maps to DSPs and adders In FIGS. 7A-7D, for example, the Verilog code that maps to DSP1 700, DSP2 720, DSP3 740, Adder1 760, and Adder 2 780, respectively, may correspond to the same numbered elements in FIG. 8. Each partitioned multiplier may have registers on its inputs and output, which the synthesis tool may detect to infer to a DSP block with its input and output registers utilized. As can be seen in FIG. 8, registers may be before or after the DSP blocks (outside of the DSP input/output registers), which may be used to register the data such that the input and output values arrive in the correct cycle Depending on the range of bits each DSP contributes to in the output, registers may be added after the DSP blocks (FIG. 8 shows two registers after DSP 1). The registers before the DSPs may depend on how many previous adders have registers on their output (FIG. 8 shows one register before DSP3, which corresponds to the previous Adder1 having its output registered).

Figure 10:
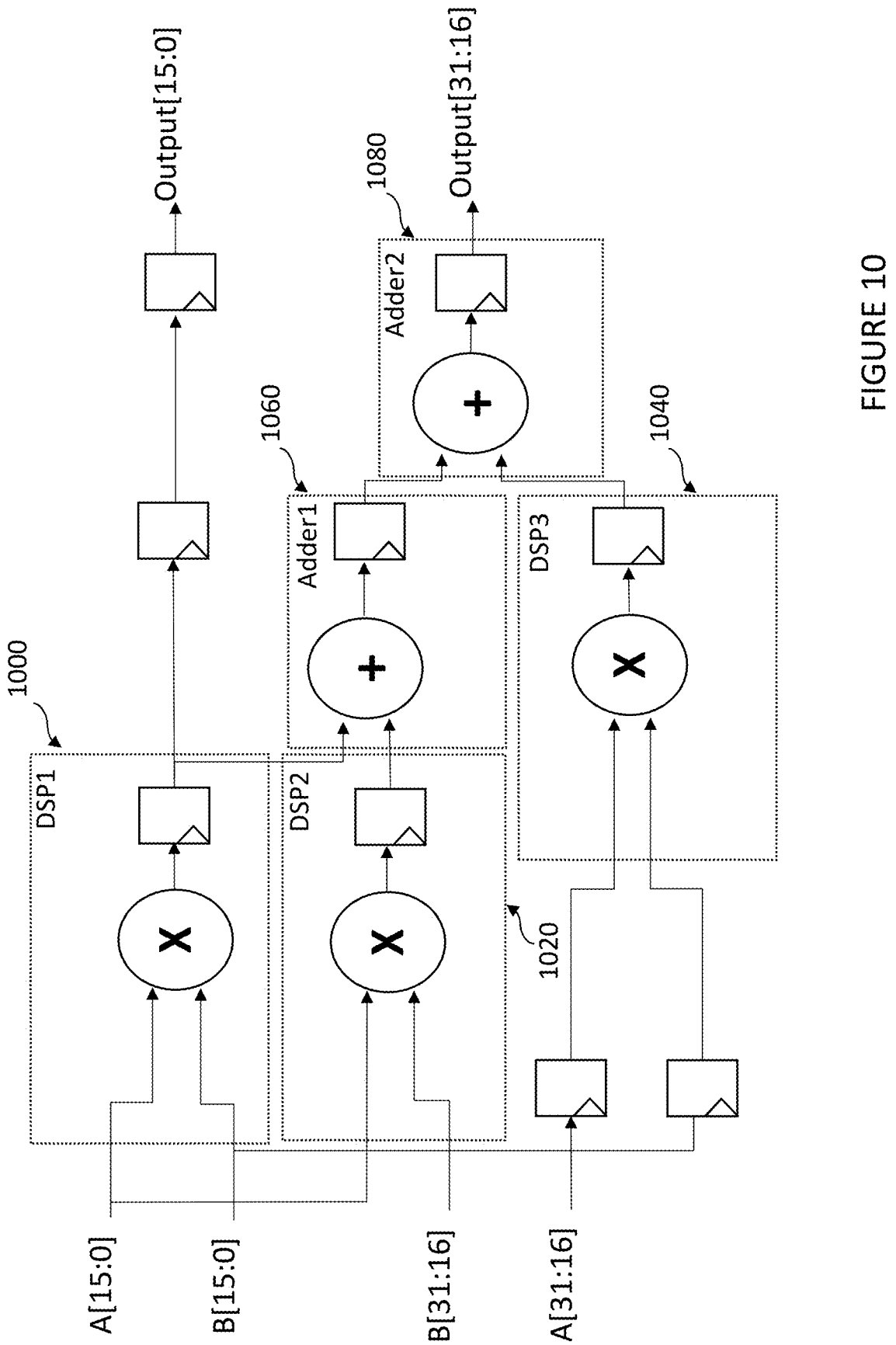
FIG. 10 illustrates an example circuit diagram for the Verilog shown in FIGS. 9A through 9D, wherein the dotted boxes show which sections of the diagram maps to DSPs and adders.

The Verilog in FIGS. 9A-9D may be represented by the circuit diagram shown in FIG. 10. The dotted boxes in FIG. 10 may also show which sections of the diagram maps to DSPs and adders In FIGS. 9A-9D, for example, the Verilog code for DSP1 900, DSP2 920, DSP3 940, Adder1 960, and Adder 2 980 may correspond to the same numbered elements in FIG. 10. Each partitioned multiplier may have registers on output (half-pipelined), which the synthesis tool may detect to infer to a DSP block with its output registers utilized (half-pipelined) As can be seen in FIG. 10, additional registers (990, 995) may be placed after the DSP blocks (outside of the DSP output registers), which may be used to register the data such that the input and output values arrive in the correct cycle. Depending on the range of bits each DSP contributes to in the output, registers may be added after the DSP blocks (FIG. 10 shows two registers after DSP 1). The registers before the DSPs may depend on how many previous adders have registers on their output (FIG. 10 shows one register before DSP3, which corresponds to Adder1 having its output registered).

According to examples of the present disclosure, in an HLS flow for DSP tech-mapping, the number of DSP blocks a multiplication will map to may be calculated, so that the appropriate number of clock cycles for the multiplication may be automatically scheduled, depending on the width of the operation as well as the widths of the target DSP. Either the output registers or both the input and output registers of each DSP may be used to ensure that the circuit will achieve high Fmax. The DSP tech-mapping algorithm described herein may work for any DSP architecture, and the input widths of the target DSP may be specified to the HLS compiler via a Tcl parameter. The DSP tech-mapping algorithm described herein may be used with or without gathering delays for different widths, latencies, and DSP architectures. In addition, this algorithm may be used whether, or not, the user knows how many cycles a multiplication should take.

Figure 12:
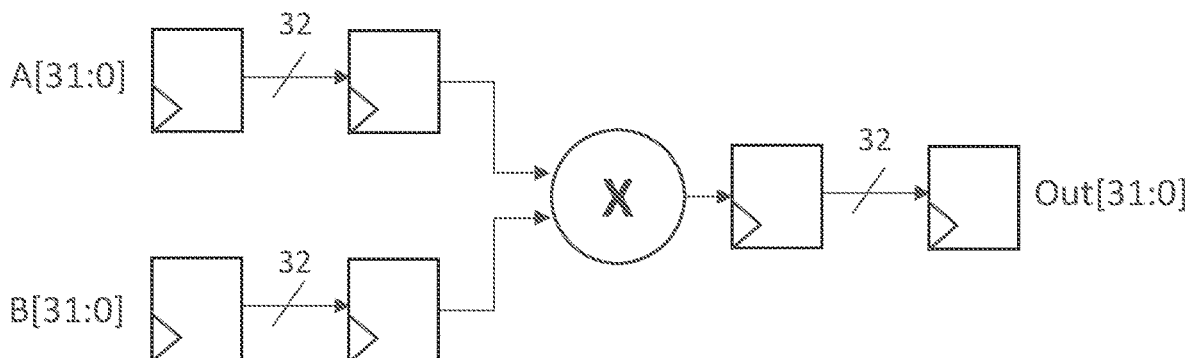
FIG. 12 illustrates an example circuit diagram for the Verilog shown in FIG. 11.

The 32-bit by 32-bit multiplier circuit with 4 cycle latency shown in FIG. 12 (corresponding to the Verilog of FIG. 11) may be transformed into a technology mapped circuit shown in FIG. 8, where each DSP block is 16-bit by 16-bit. The circuit in FIG. 8 has the same functionality, same latency, and uses the same number of DSP blocks as the circuit in FIG. 12, but the FIG. 8 circuit ensures that the input and output DSP registers can be utilized for each DSP. The reliability and portability problems of synthesis tools may be solved by generating a circuit where each multiplication in Verilog may fit in a single target DSP, with the input and/or output registers utilized for each specific DSP block, so that a synthesis tool may easily and directly map this to a DSP block in the netlist. In essence, the HLS compiler may perform the technology mapping for the synthesis tool, so that the exact configuration desired for the DSPs may be maintained. This HLS compiler may therefore be portable across different DSP architectures and may not be tied to a particular FPGA vendor. To support a different DSP architecture, one may provide the input widths of a DSP block to the HLS compiler, and the HLS compiler may automatically generate the RTL appropriate for that architecture.

Example Fmax and area results are shown for 32-bit and 64-bit unsigned multiplier circuits when targeting Microsemi PolarFire FPGA, which has 17-bit by 17-bit unsigned DSPs. Table 2 shows results for three different types of multiplier circuits.

TABLE 2

| 64-bit × 64-bit multiplication | Fmax (MHz) | Latency | # of DSPs |
|---|---|---|---|
| Mult Version 1-Latency 4 | 53.2 | 4 | 10 |
| Mult Version 1-Latency 6 | 53.23 | 6 | 10 |
| Mult Version 1-Latency 11 | 52.73 | 11 | 10 |
| Mult Version 2-Latency 4 | 113.49 | 4 | 10 |
| Mult Version 2-Latency 6 | 270.05 | 6 | 10 |
| Mult Version 2-Latency 11 | 528.54 | 11 | 10 |
| Tech-mapped half-pipelined multiplier | 351.12 | 6 | 10 |
| Tech-mapped fully-pipelined multiplier | 583.09 | 11 | 10 |

The technology mapped half-pipelined and fully pipelined multipliers (bottom two rows) were generated using examples of the present disclosure, where half-pipeline may use the output register of each DSP and fully-pipelined may use both input and output registers of each DSP. The latency may be automatically calculated. Mult Version 1 version shows metrics related to a Verilog multiplier where the synthesis tool does not utilize the input and output registers. Mult Version 2 shows metrics related to a Verilog multiplier where the synthesis tool correctly inferred the use of the DSP block's input/output registers but did not use the technology mapping of the present disclosure.

The technology mapped multipliers may achieve a higher Fmax, while using the same number of DSPs and the same latency Without technology mapping, an HLS tool may underestimate the latency of a 64-bit multiplication, leading to a latency of 4. For Mult Version 1, due to the input/output DSP registers not being utilized, the Fmax results are very low, regardless of the latency. For Mult Version 2, latency of 4 gets significantly lower Fmax than the technology mapped multipliers, but even with the same latencies as the technology mapped multipliers, the Fmax results are still lower.

Table 3 shows the area usage in terms of 4LUTs and DFFs for Mult version 2 and technology mapped multipliers.

TABLE 3

| 64-bit × 64-bit multiplication | Fabric 4LUTs + Interface 4LUTs | Fabric DFFs + Interface DFFs |
|---|---|---|
| Mult Version 2-Latency 4 | 197 + 360 = 557 | 341 + 360 = 701 |
| Mult Version 2-Latency 6 | 196 + 360 = 556 | 635 + 360 = 995 |
| Mult Version 2-Latency 11 | 196 + 360 = 556 | 1300 + 360 = 1660 |
| Tech-mapped half-pipelined mult-Latency 6 | 409 + 360 = 769 | 584 + 360 = 944 |
| Tech-mapped fully-pipelined mult-Latency 11 | 409 + 360 = 769 | 1335 + 360 = 1695 |

Overall, the technology mapped multipliers may use very similar 4LUTs and DFFs to Mult Version 2, while achieving higher Fmax. It is worth noting that for high performance circuits, achieving higher Fmax is generally more desirable than saving a small number of 4LUTs.

Tables 4 and 5 show the same type of results for 32-bit by 32-bit unsigned multiplication.

TABLE 4

| 32-bit × 32-bit muliplication | Fmax (MHz) | Latency | # of DSPs |
|---|---|---|---|
| Mult Version 1-Latency 2 | 148.19 | 2 | 3 |
| Mult Version 1-Latency 4 | 147.21 | 4 | 3 |
| Mult Version 2-Latency 2 | 270.05 | 2 | 3 |
| Mult Version 2-Latency 4 | 528.54 | 4 | 3 |
| Tech-mapped half-pipelined mult | 407.33 | 2 | 3 |
| Tech-mapped fully-pipelined mult | 670.24 | 4 | 3 |

TABLE 5

| 32-bit × 32-bit muliplication | Fabric 4LUT + Interface 4LUT | Fabric DFF + Interface DFF |
|---|---|---|
| Mult Version 2-Latency 2 | 100 + 108 = 208 | 17 + 108 = 125 |
| Mult Version 2-Latency 4 | 100 + 108 = 208 | 130 + 108 = 238 |
| Tech-mapped half-pipelined mult-Latency 2 | 130 + 108 = 238 | 32 + 108 = 140 |
| Tech-mapped fully-pipelined mult-Latency 4 | 145 + 108 = 253 | 94 + 108 = 202 |

The conclusion is the same, technology mapped multipliers may achieve a higher Fmax while using the same latency, same number of DSPs, comparable DFFs, at the expense of a small number of 4LUTs.

FIG. 13 illustrates a flow chart of an example method 1300 for HLS mapping in accordance with the present disclosure. According to one example, method 1300 may begin at block 1320. Teachings of the present disclosure may be implemented in a variety of configurations of system 100. As such, the initialization point for method 1300 and the order of 1320-1340 comprising method 1300 may depend on the implementation chosen.

At block 1320, HLS may receive a software program comprising a multiplication statement to multiply a first number by a second number, the first number having a first data type and a first bit width, and the second number having a second data type and a second bit width. At block 1330, HLS may determine a number of DSP blocks for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more. At block 1340, HLS may generate a register transfer level description of the multiplication statement wherein the register level description comprises a plurality of distinct portions corresponding to each of the two or more DSP blocks.

Although FIG. 13 discloses a particular number of operations related to method 1300, method 1300 may be executed with greater or fewer operations than those depicted in FIG. 13. For example, after block 1340, HLS may provide the generated register transfer level description to a synthesis tool to generate a structural netlist. The generated structural netlist may then be provided to place and route software to be placed and routed for bitstream generation. The generated bitstream may then be programmed onto hardware (e g., an FPGA device). In addition, although FIG. 13 discloses a certain order of operations to be taken with respect to method 1300, the operations comprising method 1300 may be completed in any suitable order.

FIG. 14 illustrates a flow chart of an example method 1400 for HLS mapping in accordance with the present disclosure. According to one example, method 1400 may begin at block 1420. Teachings of the present disclosure may be implemented in a variety of configurations of system 100. As such, the initialization point for method 1400 and the order of 1420-1440 comprising method 1400 may depend on the implementation chosen.

At block 1420, HLS may receive a software program comprising a multiplication statement to multiply a first number by a second number, the first number having a first data type and a first bit width, and the second number having a second data type and a second bit width. At block 1430, HLS may determine a number of DSP blocks for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more. At block 1435, HLS may determine a number of adder blocks for implementing the multiplication statement based at least on the first bit width, the second bit width, the first DSP bit width, and the second DSP bit width. At block 1440, HLS may generate a register transfer level description of the multiplication statement wherein the register level description comprises a plurality of distinct portions corresponding to each of the two or more DSP blocks.

Although FIG. 14 discloses a particular number of operations related to method 1400, method 1400 may be executed with greater or fewer operations than those depicted in FIG. 14. For example, after block 1440, HLS may provide the generated register transfer level description to a synthesis tool to generate a structural netlist. The generated structural netlist may then be provided to place and route software to be placed and routed for bitstream generation. The generated bitstream may then be programmed onto hardware (e.g., an FPGA device). In addition, although FIG. 14 discloses a certain order of operations to be taken with respect to method 1400, the operations comprising method 1400 may be completed in any suitable order. For example, in the example of method 1400 shown above, operation 1435 may be completed before operation 1430.

FIG. 15 illustrates a flow chart of an example method 1500 for HLS mapping in accordance with the present disclosure. According to one example, method 1500 may begin at block 1520. Teachings of the present disclosure may be implemented in a variety of configurations of system 100. As such, the initialization point for method 1500 and the order of 1520-1540 comprising method 1500 may depend on the implementation chosen.

At block 1520, HLS may receive a software program comprising a multiplication statement that multiplies a first number by a second number, the first number having a first data type and a first bit width, and the second number having a second data type and a second bit width. At block 1530, HLS may determine a number of DSP blocks of a target device for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more. At block 1540, HLS may generate a Hardware Description Language (HDL) description (e.g., RTL) of the multiplication statement wherein the HDL description comprises distinct portions corresponding to each of the two or more DSP blocks.

Although FIG. 15 discloses a particular number of operations related to method 1500, method 1500 may be executed with greater or fewer operations than those depicted in FIG. 15. For example, after block 1540, HLS may provide the generated HDL description to a synthesis tool to generate a structural netlist. The generated structural netlist may then be provided to place and route software to be placed and routed for bitstream generation. The generated bitstream may then be programmed onto hardware (e.g, an FPGA device) In addition, although FIG. 15 discloses a certain order of operations to be taken with respect to method 1500, the operations comprising method 1500 may be completed in any suitable order.

Figure 16:
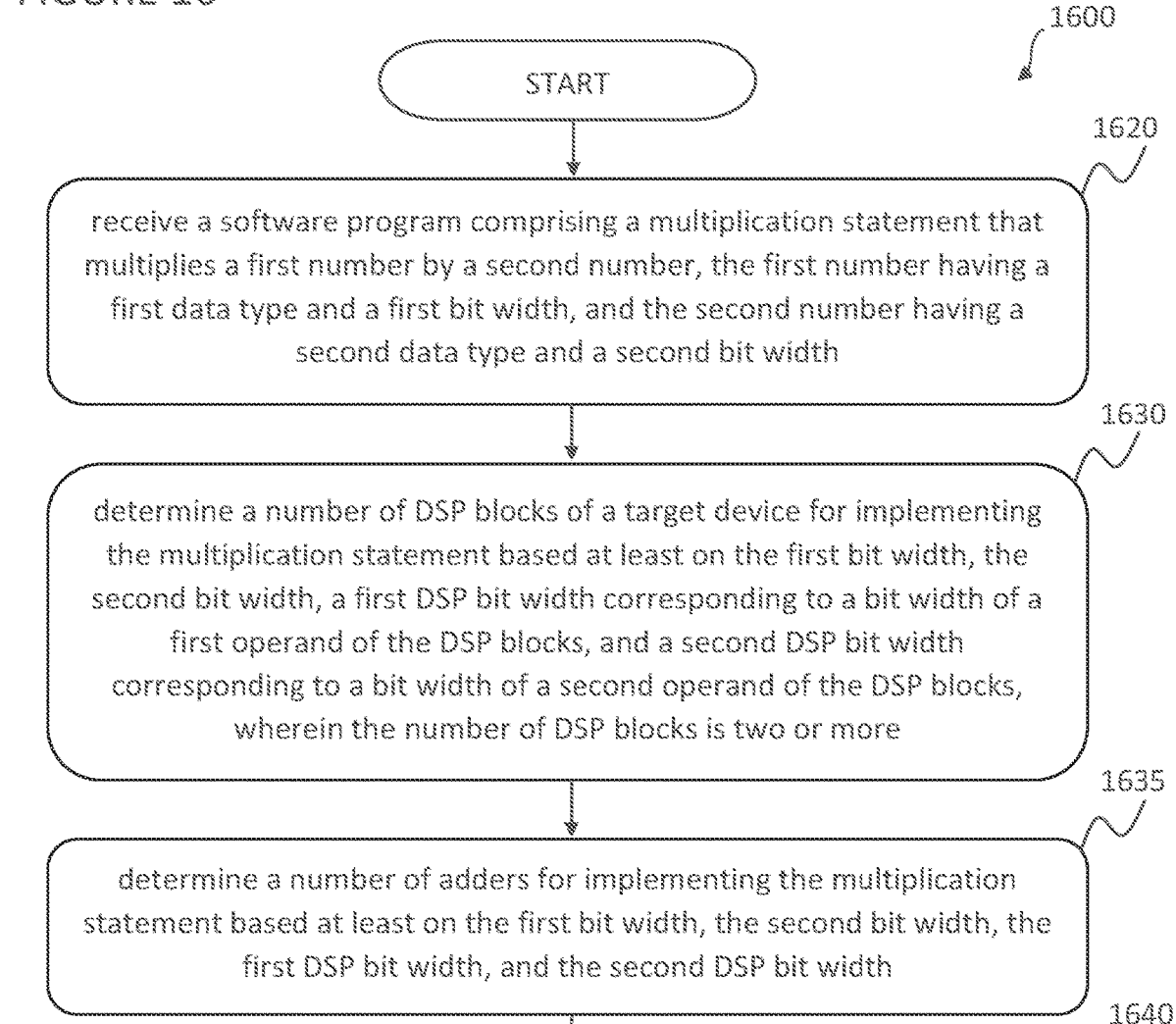
FIG. 16 illustrates a flow chart of an example method for HLS mapping.

FIG. 16 illustrates a flow chart of an example method 1600 for HLS mapping in accordance with the present disclosure. According to one example, method 1600 may begin at block 1620. Teachings of the present disclosure may be implemented in a variety of configurations of system 100. As such, the initialization point for method 1600 and the order of 1620-1640 comprising method 1600 may depend on the implementation chosen.

At block 1620, HLS may receive a software program comprising a multiplication statement that multiplies a first number by a second number, the first number having a first data type and a first bit width, and the second number having a second data type and a second bit width. At block 1630, HLS may determine a number of DSP blocks of a target device for implementing the multiplication statement based at least on the first bit width, the second bit width, a first DSP bit width corresponding to a bit width of a first operand of the DSP blocks, and a second DSP bit width corresponding to a bit width of a second operand of the DSP blocks, wherein the number of DSP blocks is two or more. At block 1635, HLS may determine a number of adders for implementing the multiplication statement based at least on the first bit width, the second bit width, the first DSP bit width, and the second DSP bit width. At block 1640, HLS may generate a Hardware Description Language (HDL) description of the multiplication statement wherein the HDL description comprises distinct portions corresponding to each of the two or more DSP blocks.

Although FIG. 16 discloses a particular number of operations related to method 1600, method 1600 may be executed with greater or fewer operations than those depicted in FIG. 16. For example, after block 1640, HLS may provide the generated HDL description to a synthesis tool to generate a structural netlist. The generated structural netlist may then be provided to place and route software to be placed and routed for bitstream generation. The generated bitstream may then be programmed onto hardware (e.g, an FPGA device). In addition, although FIG. 16 discloses a certain order of operations to be taken with respect to method 1600, the operations comprising method 1600 may be completed in any suitable order. For example, in the example of method 1600 shown above, operation 1635 may be completed before operation 1630.

FIG. 17 illustrates a flow chart of an example method 1700 for HLS mapping in accordance with the present disclosure. According to one example, method 1700 may begin at block 1720. Teachings of the present disclosure may be implemented in a variety of configurations of system 100. As such, the initialization point for method 1700 and the order of 1720-1730 comprising method 1700 may depend on the implementation chosen.

At block 1720, HLS may determine a partial product multiplication corresponding to the multiplication statement and having two or more partial product statements, the determining based at least on the first bit width, the second bit width, a first DSP bit width corresponding to a bit width of a first operand of the plurality of DSP blocks, and a second DSP bit width corresponding to a bit width of a second operand of the plurality of DSP blocks. At block 1730, HLS may generate an HDL description of the multiplication statement wherein the HDL description comprises distinct portions corresponding to each of the two or more partial product statements.

Although FIG. 17 discloses a particular number of operations related to method 1700, method 1700 may be executed with greater or fewer operations than those depicted in FIG. 17. For example, after block 1730, HLS may provide the generated HDL description to a synthesis tool to generate a structural netlist. The generated structural netlist may then be provided to place and route software to be placed and routed for bitstream generation. The generated bitstream may then be programmed onto hardware (e.g., an FPGA device). In addition, although FIG. 17 discloses a certain order of operations to be taken with respect to method 1700, the operations comprising method 1700 may be completed in any suitable order.

Methods 1300-1700 may be implemented using information handling system 100 or any other system operable to implement methods 1300-1700. In certain examples, methods 1300-1700 may be implemented partially or fully in software embodied in computer-readable media.

Using the methods and systems disclosed herein, problems associated with conventional approaches to HLS may be improved, reduced, or eliminated.

Although examples have been described above, other variations and examples may be made from this disclosure without departing from the spirit and scope of these disclosed examples.

What is claimed is:

1. A machine-implemented method for creating a register transfer level description of an electronic circuit design utilizing hardware digital signal processing (DSP) blocks, comprising:

receiving a software program executable by an information handling system comprising a multiplication statement to multiply a first number by a second number, the first number having a first data type and a first bit width, and the second number having a second data type and a second bit width, the first data type and the second data type comprising software data types capable of multiplication by the electronic circuit design utilizing hardware DSP blocks;

determining a number of hardware DSP blocks for implementing the multiplication statement of the software program based at least on the first bit width of the first number, the second bit width of the second number, a first DSP bit width corresponding to a bit width of a first operand of the number of hardware DSP blocks, and a second DSP bit width corresponding to a bit width of a second operand of the number of hardware DSP blocks, wherein the number of hardware DSP blocks is two or more; and generating a register transfer level description of the multiplication statement for a hardware circuit, wherein the register level description comprises a plurality of distinct portions corresponding to each of the number of hardware DSP blocks.

2. The machine-implemented method of claim 1, wherein each of the two or more hardware DSP blocks comprise respective input DSP registers and output DSP registers, and the distinct portions of the register transfer level description comprise statements corresponding to the output DSP registers of the two or more hardware DSP blocks.

3. The machine-implemented method of claim 2, wherein the distinct portions of register transfer level description comprise statements corresponding to the input DSP registers of the two or more hardware DSP blocks.

4. The machine-implemented method of claim 1, wherein the first data type is a signed data type.

5. The machine-implemented method of claim 1, wherein the number of hardware DSP blocks is based on using a partial product multiplication to implement the multiplication statement of the software program.

6. The machine-implemented method of claim 5, wherein determining the number of hardware DSP blocks for implementing the multiplication statement of the software program is based on a result bit width, and the number of hardware DSP blocks is reduced when an offset of the partial product multiplication exceeds the result bit width.

7. The machine-implemented method of claim 1, comprising:

determining a number of adder blocks for implementing the multiplication statement of the software program based at least on the first bit width of the first number, the second bit width of the second number, the first DSP bit width, and the second DSP bit width;

wherein the register transfer level description of the multiplication statement of the software program comprises distinct portions corresponding to each of the number of adder blocks.

8. An apparatus, comprising a non-transitory, machine-readable medium including instructions wherein the instructions, when loaded and executed by a processor, configure the processor to:

receive a software program executable by an information handling system comprising a multiplication statement that multiplies a first number by a second number, the first number having a first data type and a first bit width, and the second number having a second data type and a second bit width, the first data type and the second data type comprising software data types capable of multiplication by target hardware device utilizing hardware DSP blocks;

determine a number of hardware DSP blocks of the target hardware device for implementing the multiplication statement of the software program based at least on the first bit width of the first number, the second bit width of the second number, a first DSP bit width corresponding to a bit width of a first operand of the number of hardware DSP blocks, and a second DSP bit width corresponding to a bit width of a second operand of the number of hardware DSP blocks, wherein the number of DSP blocks is two or more; and generate a Hardware Description Language (HDL) description of the multiplication statement wherein the HDL description comprises distinct portions corresponding to each of the two or more number of hardware DSP blocks.

9. The apparatus of claim 8, wherein each of the number of hardware DSP blocks comprise respective input DSP registers and output DSP registers, and the distinct portions of HDL description comprise statements corresponding to the output DSP registers of the number of hardware DSP blocks.

10. The apparatus of claim 9, wherein the distinct portions of HDL description comprise statements corresponding to the input DSP registers of the number of hardware DSP blocks.

11. The apparatus of claim 8, wherein the first data type is a signed data type.

12. The apparatus of claim 8, wherein the number of hardware DSP blocks is based on using a partial product multiplication to implement the multiplication statement of the software program.

13. The apparatus of claim 12, wherein, to determine determining the number of hardware DSP blocks for implementing the multiplication statement of the software program, the instructions configure the processor to determine the number of hardware DSP blocks for implementing the multiplication statement of the software program based on a result bit width, and the number of hardware DSP blocks is reduced when an offset of the partial product multiplication exceeds the result bit width.

14. The apparatus of claim 8:

wherein the instructions configure the processor to determine a number of adders for implementing the multiplication statement of the software program based at least on the first bit width of the first number, the second bit width of the second number, the first DSP bit width, and the second DSP bit width; and wherein the HDL description of the multiplication statement of the software program comprises distinct portions corresponding to each of the number of adders.

15. A machine program product, the machine program product comprising a machine readable storage medium having program instructions embodied therewith, the program instructions executable by a computing device to cause the computing device to:

convert a multiplication statement in a high-level software language into a Hardware Description Language (HDL) for a programmable hardware circuit having a plurality of hardware DSP blocks, the multiplication statement in the high-level software language comprising a first number multiplied by a second number, the first number having a first data type and a first bit width, and the second number having a second data type and a second bit width, the first data type and the second data type comprising software data types capable of multiplication by the programmable hardware circuit utilizing the plurality of hardware DSP blocks;

wherein, to convert the multiplication statement in the high-level software language into the HDL for the programmable hardware circuit, the program instructions cause the computing device to:

determine a partial product multiplication corresponding to the multiplication statement in the high-level software language and having two or more partial product statements based at least on the first bit width of the first number, the second bit width of the second number, a first DSP bit width corresponding to a bit width of a first operand of the plurality of hardware DSP blocks, and a second DSP bit width corresponding to a bit width of a second operand of the plurality of hardware DSP blocks; and generate an HDL description of the multiplication statement in the high-level software language, wherein the HDL description comprises distinct portions corresponding to each of the two or more partial product statements.

16. The machine program product of claim 15, wherein, to determine the partial product multiplication having two or more partial product statements, the program instructions cause the programming device to reduce the number of partial product statements when an offset of a particular partial product statement exceeds a result bit width of the multiplication statement in the high-level software language.

17. The machine program of claim 15, wherein, to determine the partial product multiplication having the two or more partial product statements, the program instructions cause the computing device to determine the partial product multiplication having the two or more partial product statements based on:

$$A\left[Wa - 1{:}0\right] \times B\left[Wb - 1{:}0\right] =$$

$$\sum_{Na=0}^{ceil\left(\frac{Wa}{Da}\right)-1} \sum_{Nb=0}^{ceil\left(\frac{Wb}{Db}\right)-1} \left(A\left[MSBa{:}LSBa\right] \times B\left[MSBb{:}LSBb\right] \ll \right.$$

$$\left.(LSBa + LSBb),\right.$$

wherein A is the first number, B is the second number, Wa is the first bit width of the first number, Wb is the second bit width of thr second number, Da is the first DSP bit width, Db is the second DSP bit width, ceil(X) is a function that rounds a value of X to a small integral value that is not less than X, MSBa is min(Wa, Da* (Na+1))−1, MSBb is min(Wb, Db*(Nb+1))−1, LSBa=Da*Na, LSBb=Db*Nb, and min(X, Y) is a function that results in a minimum value between X and Y.

18. The machine program of claim 17, wherein:
at least one of the first data type and the second data type is a signed data type;
a signed partition of the two or more partial product statements is sign-extended when the bit width of the signed partition is smaller than a signed bit width of the plurality of hardware DSP blocks; and
an unsigned partition of the two or more partial product statements is zero-extended when the bit width of the unsigned partition is smaller than the signed bit width of the plurality of hardware DSP blocks.

19. The machine program of claim 17, wherein
the number of partial product statements corresponds to a number of the plurality of hardware DSP blocks for implementing, in the programmable hardware circuit, the multiplication statement in the high-level software language; and
the number of the plurality of hardware DSP blocks is:

$$ceil\left(\frac{Wa}{Da}\right) \times ceil\left(\frac{Wb}{Db}\right) -$$

$$(number\ of\ DSPs\ where\ (LSBa + LSBb) \geq a\ result\ bit\ width).$$

20. The machine program of claim 15, wherein each of the plurality of hardware DSP blocks comprise respective input DSP registers and output DSP registers, and the distinct portions of HDL comprise statements using the respective input and output DSP registers.

* * * * *